(12) United States Patent
Sybert et al.

(10) Patent No.: US 10,767,045 B2
(45) Date of Patent: Sep. 8, 2020

(54) COMPATIBILIZED COMPOSITIONS, ARTICLES FORMED THEREFROM, AND METHODS OF MANUFACTURE

(71) Applicant: SABIC GLOBAL TECHNOLOGIES B.V., Bergen Op Zoom (NL)

(72) Inventors: Paul Dean Sybert, Evansville, IN (US); Tony Farrell, Bergen Op Zoom (NL); Rob Boonman, Oosterhout (NL); Robert Dirk Van De Grampel, Tholen (NL); Mark Adrianus Johannes Van Der Mee, Breda (NL)

(73) Assignee: SABIC GLOBAL TECHNOLOGIES B.V., Bergen op Zoom (NL)

( * ) Notice: Subject to any disclaimer, the term of this patent is extended or adjusted under 35 U.S.C. 154(b) by 0 days.

(21) Appl. No.: 16/095,153

(22) PCT Filed: Apr. 28, 2017

(86) PCT No.: PCT/IB2017/052509
§ 371 (c)(1),
(2) Date: Oct. 19, 2018

(87) PCT Pub. No.: WO2017/187429
PCT Pub. Date: Nov. 2, 2017

(65) Prior Publication Data
US 2019/0136048 A1    May 9, 2019

Related U.S. Application Data

(60) Provisional application No. 62/328,870, filed on Apr. 28, 2016.

(51) Int. Cl.
*C08L 69/00* (2006.01)
*C08G 64/06* (2006.01)
*C23C 14/20* (2006.01)

(52) U.S. Cl.
CPC .............. *C08L 69/00* (2013.01); *C08G 64/06* (2013.01); *C08L 2205/025* (2013.01); *C23C 14/20* (2013.01)

(58) Field of Classification Search
None
See application file for complete search history.

(56) References Cited

U.S. PATENT DOCUMENTS

| | | |
|---|---|---|
| 5,034,458 A | 7/1991 | Serini et al. |
| 5,849,845 A | 12/1998 | Kohler et al. |

(Continued)

FOREIGN PATENT DOCUMENTS

| | | |
|---|---|---|
| WO | 2009140611 A1 | 11/2009 |
| WO | 2013175448 A1 | 11/2013 |

(Continued)

OTHER PUBLICATIONS

International Search Report for International Applicatio No. PCT/IB2017/052503, International Filing Date Apr. 28, 2017, dated Jul. 6, 2017, 5 pages.

(Continued)

*Primary Examiner* — Robert T Butcher
(74) *Attorney, Agent, or Firm* — Cantor Colburn LLP

(57) ABSTRACT

A melt-blend composition is formed from, based on the total weight of the melt-blend composition, 0 to 5 wt. % of an additive; and 95 to 100 wt. % of a polymer composition, wherein the polymer composition comprises, based on the total weight of the polymer composition, 5 to 95 wt. % of a first copolycarbonate consisting of bisphenol A carbonate units and first additional carbonate units of the formula (II), (II), (III), (IV) or (V); 95 to 5 wt. % of a second copolycarbonate consisting of bisphenol A carbonate units and second additional carbonate units (phthalimidine carbonate units); and 0.001 to 0.1 wt. % of a transesterification catalyst, wherein the melt-blended composition has a haze of less than 15% and a transmission greater than 75%, each measured using the color space CIE1931 (Illuminant C and a 2° observer) at a 3.2 mm thickness.

(Continued)

-continued

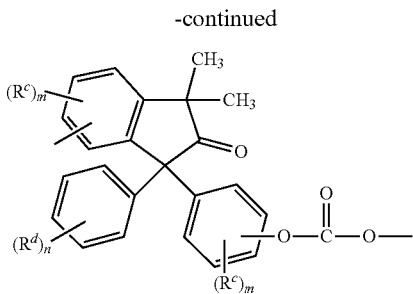
(IV)

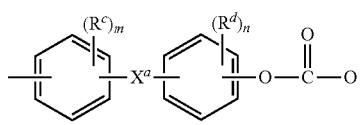

(V)

20 Claims, 1 Drawing Sheet

(56) References Cited

U.S. PATENT DOCUMENTS

| | | | |
|---|---|---|---|
| 7,358,321 B2 | 4/2008 | Mahood et al. | |
| 7,491,788 B1 | 2/2009 | Leenders et al. | |
| 8,030,400 B2 | 10/2011 | Kung et al. | |
| 2009/0030171 A1 | 1/2009 | Leenders et al. | |
| 2011/0144283 A1 | 6/2011 | Heuer et al. | |
| 2011/0151262 A1 | 6/2011 | Heuer et al. | |
| 2011/0152470 A1 | 6/2011 | Meyer et al. | |
| 2012/0252985 A1 | 10/2012 | Rosenquist et al. | |
| 2013/0200415 A1 | 6/2013 | Evans et al. | |
| 2015/0299460 A1* | 10/2015 | Vollenberg | C08K 3/013 |
| | | | 428/220 |
| 2017/0022360 A1 | 1/2017 | Farrell et al. | |
| 2019/0135977 A1 | 5/2019 | Sybert et al. | |

FOREIGN PATENT DOCUMENTS

| | | |
|---|---|---|
| WO | 2014072923 A1 | 5/2014 |
| WO | 2015160965 A1 | 10/2015 |
| WO | 2017187425 A1 | 11/2017 |

OTHER PUBLICATIONS

International Search Report for International Application No. PCT/IB2017/052509, International Filing Date Apr. 28, 2017, dated Aug. 3, 2017, 6 pages.

Written Opinion for International Applicatio No. PCT/IB2017/052503, International Filing Date Apr. 28, 2017, dated Jul. 6, 2017, 6 pages.

Written Opinion for International Application No. PCT/IB2017/052509, International Filing Date Apr. 28, 2017, dated Aug. 3, 2017, 6 pages.

* cited by examiner

COMPATIBILIZED COMPOSITIONS, ARTICLES FORMED THEREFROM, AND METHODS OF MANUFACTURE

CROSS REFERENCE TO RELATED APPLICATIONS

This application is a National Stage application of PCT/IB2017/052509, filed Apr. 28, 2017, which claims the benefit of U.S. Provisional Application No. 62/328,870, filed Apr. 28, 2016, both of which are incorporated by reference in their entirety herein.

BACKGROUND

This disclosure is directed to compatibilized thermoplastic compositions, articles formed therefrom, and their methods of manufacture, and in particular compatibilized thermoplastic compositions with advantageous properties such as high heat resistance and good surface properties.

Polycarbonates are useful in the manufacture of articles and components for a wide range of applications, from automotive parts to electronic appliances. Because of their broad use, particularly in automotive, lighting and consumer electronics industries, it is desirable to provide polycarbonates having high heat capacities and good surface properties such as the ability to be metalized. Moreover, although metallized parts are often opaque, the haze in opaque parts can lead to visual flow lines and microscopic roughness that decrease the reflective nature of the metallized parts. Further, once the parts to be metallized are molded, the parts are often visually inspected for defects. Hazy materials make it difficult to observe any defects that may later lead to a defect in the metallized part.

Accordingly, there remains a need for polycarbonates that have a combination of improved thermal performance such as high heat deflection temperature and good surface properties such as good adhesion to metal without a significant detrimental effect on one or more of material cost, processability, and mechanical properties. It would be a further advantage if the polycarbonates had good transparency.

SUMMARY

A thermoplastic composition comprises: a polycarbonate terpolymer comprising first repeating units, second repeating units different from the first repeating units, and third repeating units different from the first and second repeating units; and wherein the first repeating units are phthalimidine carbonate units of the formula

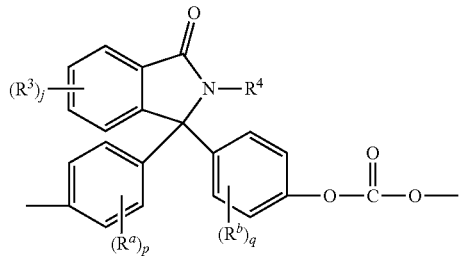

wherein $R^a$ and $R^b$ are each independently a $C_{1-12}$ alkyl, $C_{2-12}$ alkenyl, $C_{3-8}$ cycloalkyl, or $C_{1-12}$ alkoxy, each $R^3$ is independently a $C_{1-6}$ alkyl, $R^4$ is hydrogen, $C_{2-6}$ alkyl or phenyl optionally substituted with 1 to 5 $C_{1-6}$ alkyl groups, p, q, and j are each independently 0 to 4; the second repeating units are carbonate units of the formula

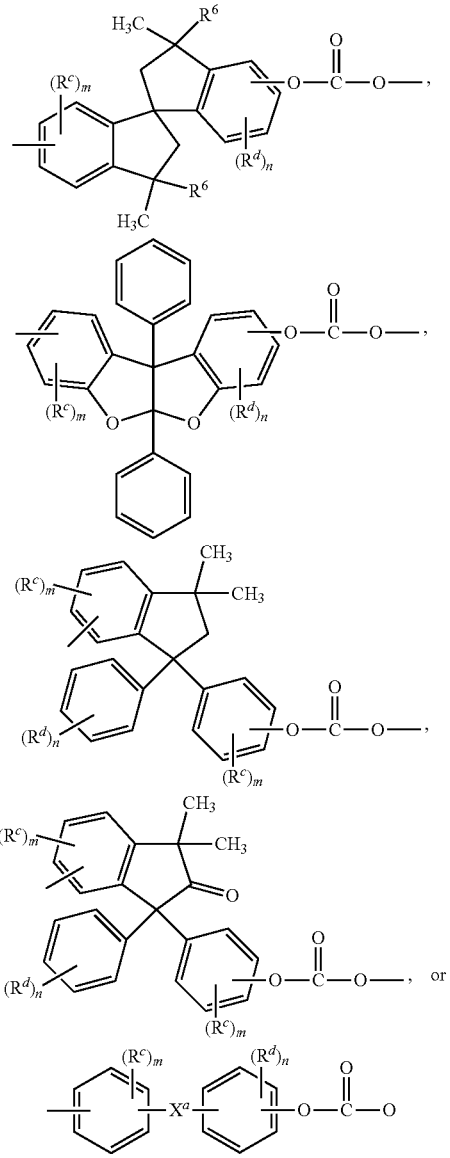

wherein $R^c$ and $R^d$ are each independently a $C_{1-12}$ alkyl, $C_{2-12}$ alkenyl, $C_{3-8}$ cycloalkyl, or $C_{1-12}$ alkoxy, each $R^6$ is independently $C_{1-3}$ alkyl or phenyl, $X^a$ is a $C_{6-12}$ polycyclic aryl, $C_{3-18}$ mono- or polycycloalkylene, $C_{3-18}$ mono- or polycycloalkylidene, $-(Q^1)_x-G-(Q^2)_y$- group wherein $Q^1$ and $Q^2$ are each independently a $C_{1-3}$ alkylene, G is a $C_{3-10}$ cycloalkylene, x is 0 or 1, and y is 1; and m and n are each independently 0 to 4; and the third repeating units are carbonate units of the formula

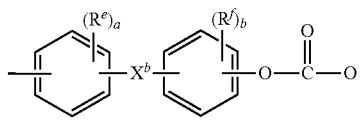

wherein $R^e$ and $R^f$ are each independently $C_{1-12}$ alkyl, $C_{2-12}$ alkenyl, $C_{3-8}$ cycloalkyl, or $C_{1-12}$ alkoxy, a and b are each independently integers of 0 to 4, and $X^b$ is a single bond, —O—, —S—, —S(O)—, —S(O)$_2$—, —C(O)—, or $C_{1-32}$ bridging hydrocarbon group, provided that $X^b$ is not a phthalimidine group or $X^a$; and a second polycarbonate, wherein the second polycarbonate comprises a first copolycarbonate consisting of bisphenol A carbonate units and first additional carbonate units of the formula

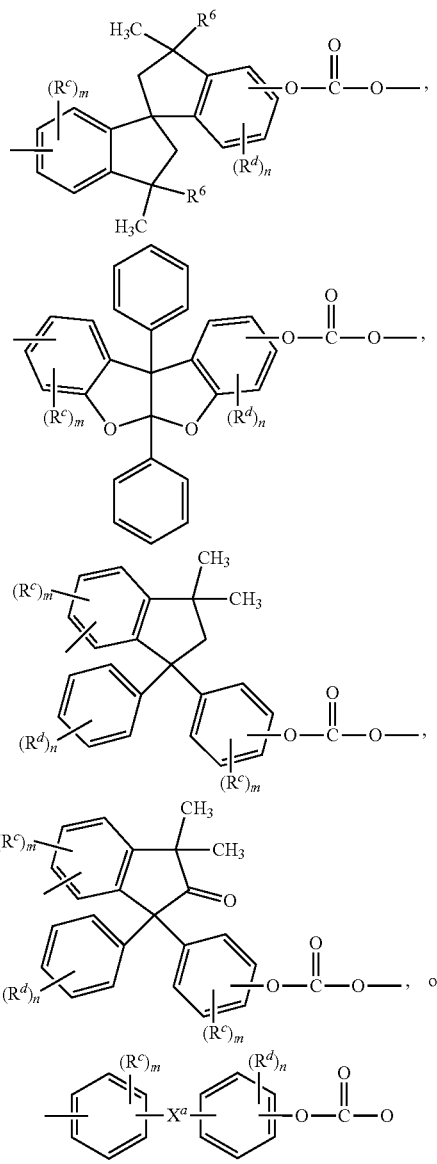

wherein $R^c$ and $R^d$ are each independently a $C_{1-12}$ alkyl, $C_{2-12}$ alkenyl, $C_{3-8}$ cycloalkyl, or $C_{1-12}$ alkoxy, each $R^6$ is independently $C_{1-3}$ alkyl or phenyl, $X^a$ is a $C_{6-12}$ polycyclic aryl, $C_{3-18}$ mono- or polycycloalkylene, $C_{3-18}$ mono- or polycycloalkylidene, -(Q$^1$)$_x$-G-(Q$^2$)$_y$- group wherein Q$^1$ and Q$^2$ are each independently a $C_{1-3}$ alkylene, G is a $C_{3-10}$ cycloalkylene, x is 0 or 1, and y is 1; and m and n are each independently 0 to 4; or a second copolycarbonate consisting of bisphenol A carbonate units and second additional carbonate units of the formula

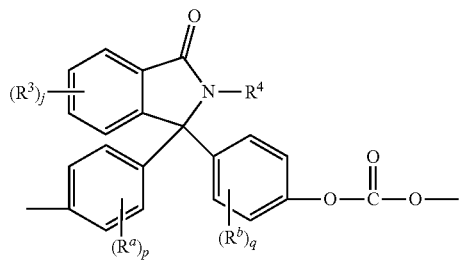

wherein $R^a$ and $R^b$ are each independently a $C_{1-12}$ alkyl, $C_{2-12}$ alkenyl, $C_{3-8}$ cycloalkyl, or $C_{1-12}$ alkoxy, each $R^3$ is independently a $C_{1-6}$ alkyl, $R^4$ is hydrogen, $C_{1-6}$ alkyl or phenyl optionally substituted with 1 to 5 $C_{1-6}$ alkyl groups, p, q, and j are each independently 0 to 4, or a combination comprising at least one of the foregoing copolycarbonates, wherein the composition has a haze of less than 15% and a transmission greater than 75%, each measured using the color space CIE1931 (Illuminant C and a 2° observer) at a 3.2 mm thickness.

A melt-blend composition formed from, based on the total weight of the melt-blend composition, 0 to 5 wt. % of an additive; and 95 to 100 wt. % of a polymer composition, wherein the polymer composition comprises, based on the total weight of the polymer composition, 5 to 95 wt. % of a first copolycarbonate consisting of bisphenol A carbonate units and first additional carbonate units of the formula

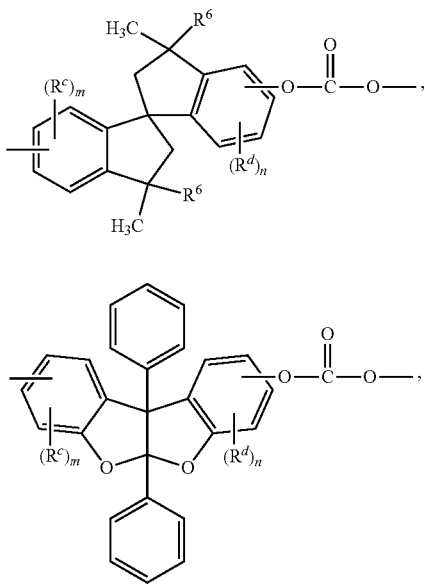

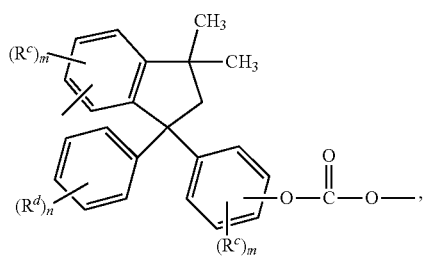

-continued

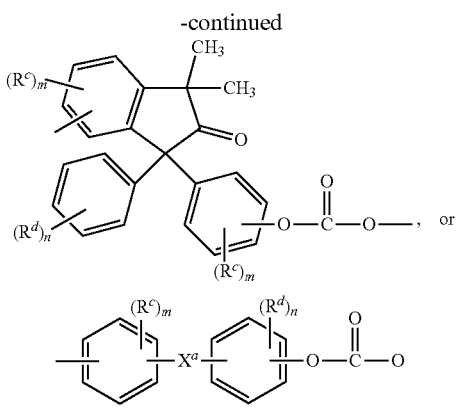

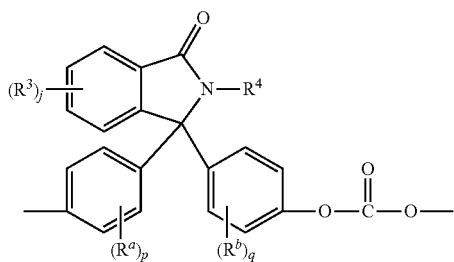

wherein $R^c$ and $R^d$ are each independently a $C_{1-12}$ alkyl, $C_{2-12}$ alkenyl, $C_{3-8}$ cycloalkyl, or $C_{1-12}$ alkoxy, each $R^6$ is independently $C_{1-3}$ alkyl or phenyl, $X^a$ is a $C_{6-12}$ polycyclic aryl, $C_{3-18}$ mono- or polycycloalkylene, $C_{3-18}$ mono- or polycycloalkylidene, $-(Q^1)_x-G-(Q^2)_y-$ group wherein $Q^1$ and $Q^2$ are each independently a $C_{1-3}$ alkylene, G is a $C_{3-10}$ cycloalkylene, x is 0 or 1, and y is 1; and m and n are each independently 0 to 4; 95 to 5 wt. % of a second copolycarbonate consisting of bisphenol A carbonate units and second additional carbonate units of the formula

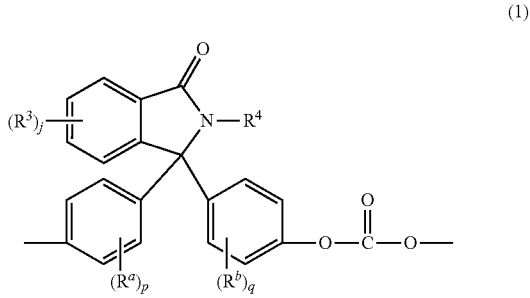

wherein $R^a$ and $R^b$ are each independently a $C_{1-12}$ alkyl, $C_{2-12}$ alkenyl, $C_{3-8}$ cycloalkyl, or $C_{1-12}$ alkoxy, each $R^3$ is independently a $C_{1-6}$ alkyl, $R^4$ is hydrogen, $C_{1-6}$ alkyl or phenyl optionally substituted with 1 to 5 $C_{1-6}$ alkyl groups, p, q, and j are each independently 0 to 4; and 0.001 to 0.1 wt. % of a transesterification catalyst, wherein the melt-blended composition has a haze of less than 15% and a transmission greater than 75%, each measured using the color space CIE1931 (Illuminant C and a 2° observer) at a 3.2 mm thickness.

In another embodiment, an article made from the above-described thermoplastic composition is provided. The article is a molded article, a thermoformed article, an extruded film, an extruded sheet, one or more layers of a multi-layer article, a substrate for a coated article, or a substrate for a metallized article.

In still another embodiment, a metallized article comprises a substrate comprising the above-described thermoplastic composition and a metal layer disposed on at least one side of the substrate.

The above described and other features are exemplified by the following drawings, detailed description, examples, and claims.

BRIEF DESCRIPTION OF THE DRAWINGS

A description of the figures, which are meant to be exemplary and not limiting, is provided in which.

DETAILED DESCRIPTION

Figure 1:
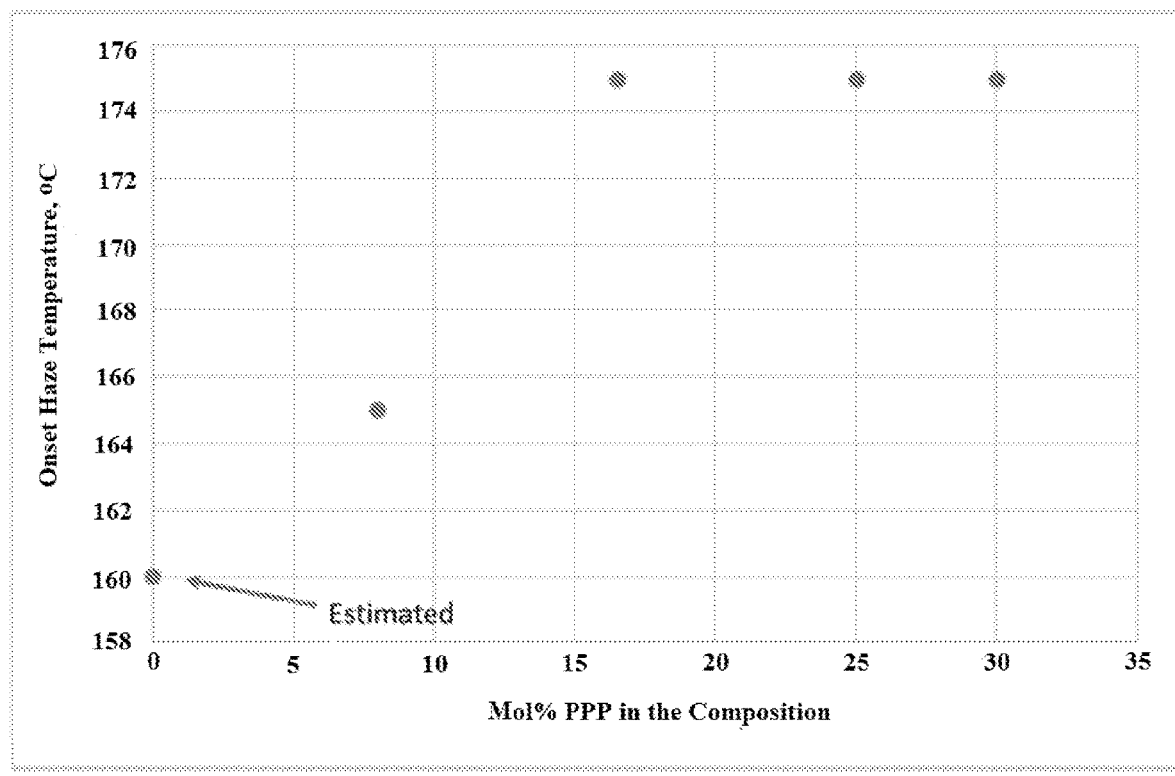
FIG. 1 shows defect onset temperature as a function of mol % of PPPBP units in the composition.

The inventors hereof have found that polycarbonate terpolymers comprising phthalimidine carbonate units, carbonate units derived from a high heat monomer such as 1,1-bis(4-hydroxyphenyl)-3,3,5-trimethyl-cyclohexane, and carbonate units derived from another bisphenol such as bisphenol A can be used as a compatibilizer for certain copolycarbonates such as copolycarbonate consisting of bisphenol A carbonate units and 1,1-bis(4-hydroxyphenyl)-3,3,5-trimethyl-cyclohexane carbonate units, copolycarbonate consisting of bisphenol A carbonate units and phthalimidine carbonate units, or a combination thereof. The compatibilized compositions can have one or more of good transparency, excellent metal adhesion properties or high defect onset temperatures, preferably all three of the foregoing.

The inventors have also found that compatibilized compositions can be provided by melt blending otherwise incompatible blends in the presence of a transesterification catalyst, to provide compositions containing the terpolymer.

As used herein, the polycarbonate terpolymers have first, second, and third repeating units, wherein the first repeating units are phthalimidine carbonate units, the second repeating units are bisphenol carbonate units different from the first repeating units, and the third repeating units are bisphenol carbonate units different from the first and second repeating units.

The first repeating units are phthalimidine carbonate units of formula (1)

(1)

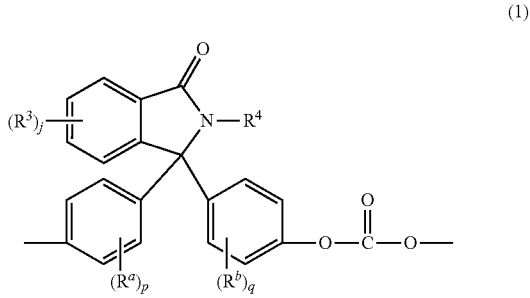

wherein $R^a$ and $R^b$ are each independently a $C_{1-12}$ alkyl, $C_{2-12}$ alkenyl, $C_{3-8}$ cycloalkyl, or $C_{1-12}$ alkoxy, preferably a $C_{1-3}$ alkyl, each $R^3$ is independently a $C_{1-6}$ alkyl, $R^4$ is hydrogen, $C_{1-6}$ or $C_{2-6}$ alkyl or phenyl optionally substituted with 1 to 5 $C_{1-6}$ alkyl groups, and p and q are each independently 0 to 4, preferably 0 to 1. For example, the phthalimidine carbonate units can be of formula (1a)

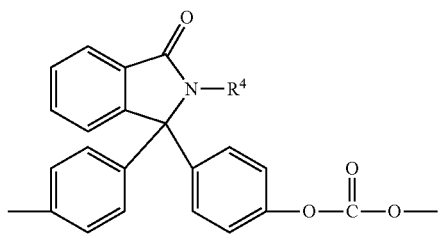

(1a)

wherein $R^5$ is hydrogen, phenyl optionally substituted with up to five $C_{1-6}$ alkyl groups, or $C_1$-4 alkyl, preferably $C_{2-4}$ alkyl. In an embodiment, $R^5$ is hydrogen or phenyl, preferably phenyl. Carbonate units (1a) wherein $R^5$ is phenyl can be derived from 2-phenyl-3,3'-bis(4-hydroxy phenyl)phthalimidine (also known as 3,3-bis(4-hydroxyphenyl)-2-phenylisoindolin-1-one or N-phenyl phenolphthalein or "PPPBP").

The second repeating units are carbonate units of the formula (2), (3), (4), (16), or (17)

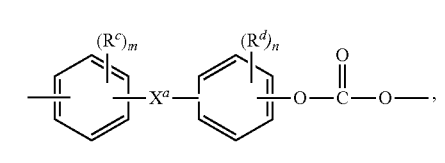

(2)

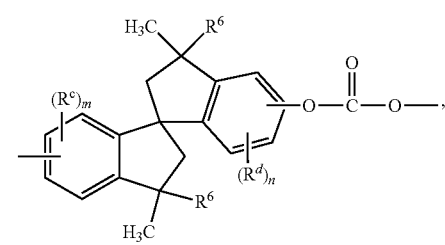

(3)

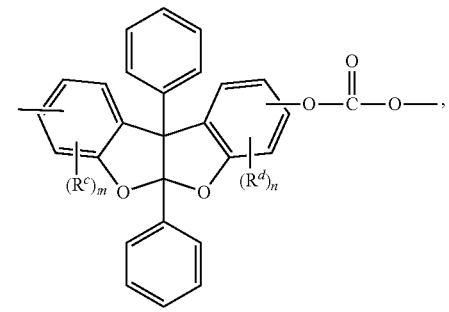

(4)

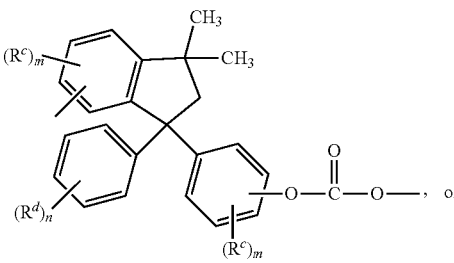

(16)

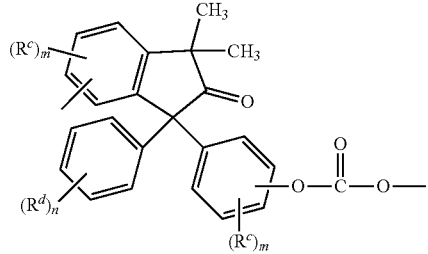

(17)

wherein $R^c$ and $R^d$ are each independently a $C_{1-12}$ alkyl, $C_{2-12}$ alkenyl, $C_{3-8}$ cycloalkyl, or $C_{1-12}$ alkoxy, each $R^6$ is independently $C_{1-3}$ alkyl or phenyl, preferably methyl, $X^a$ is a $C_{6-12}$ polycyclic aryl, $C_{3-18}$ mono- or polycycloalkylene, $C_{3-18}$ mono- or polycycloalkylidene, -$(Q^1)_x$-G-$(Q^2)_y$- group wherein $Q^1$ and $Q^2$ are each independently a $C_{1-3}$ alkylene, G is a $C_{3-10}$ cycloalkylene, x is 0 or 1, and y is 1; and m and n are each independently 0 to 4.

Exemplary second repeating units include the following:

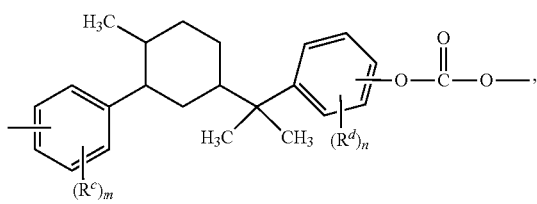

(2a)

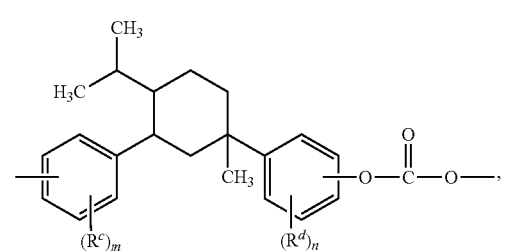

(2b)

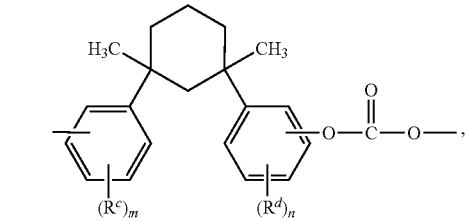

(2c)

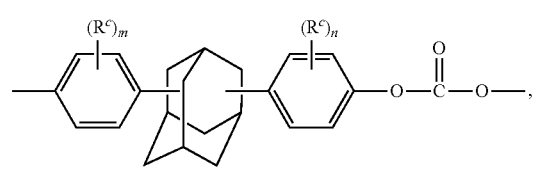

(2d)

-continued (2e)
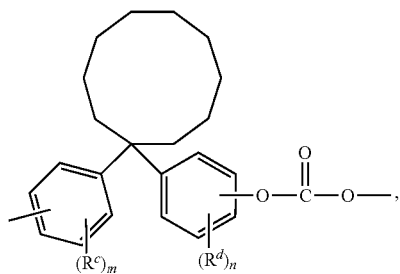

(2f)
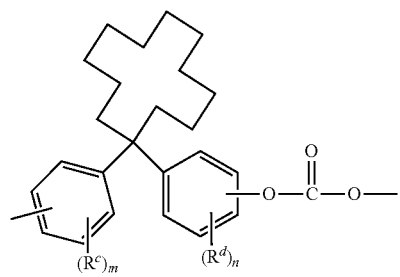

(2g)
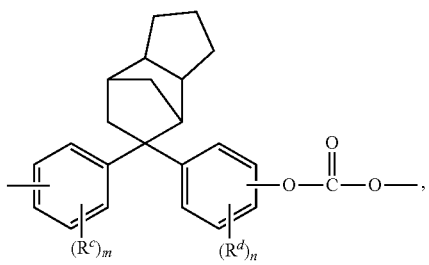

(2h)
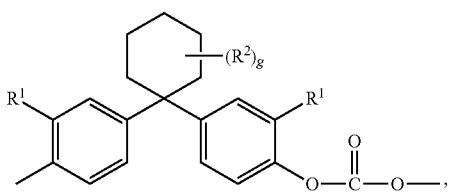

(2i)
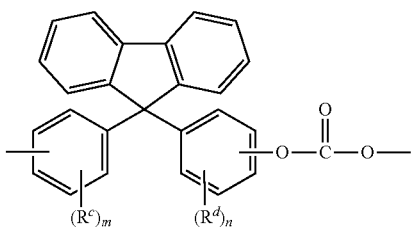

wherein $R^c$, $R^d$, m, and n are the same as defined herein for formulas (2)-(4), (16), and (17), each $R^1$ is independently hydrogen or $C_{1-4}$ alkyl, each $R^2$ is independently $C_{1-4}$ alkyl, and g is 0 to 10. In a specific embodiment the second repeating units are 1,1-bis(4-hydroxyphenyl)-3,3,5-trimethyl-cyclohexane carbonate units, 1,1-bis(4-hydroxy-3-methylphenyl)cyclohexane, or a combination thereof. Preferably, the second repeating units are 1,1-bis(4-hydroxyphenyl)-3,3,5-trimethyl-cyclohexane (BPA TMC) carbonate units.

The third repeating units are bisphenol carbonate units of formula (5)

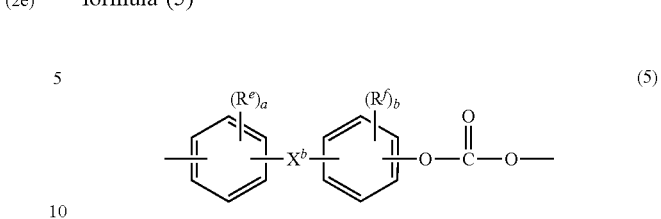

wherein $R^e$ and $R^f$ are each independently $C_{1-12}$ alkyl, $C_{2-12}$ alkenyl, $C_{3-8}$ cycloalkyl, or $C_{1-12}$ alkoxy, a and b are each independently 0 to 4, and $X^b$ is a bridging group between the two arylene groups, and is a single bond, —O—, —S—, —S(O)—, —S(O)$_2$—, —C(O)—, or a $C_{1-32}$ bridging hydrocarbon group, provided that $X^b$ is not a phthalimidine group or $X^a$. In an embodiment, $X^b$ is a $C_{1-11}$ alkylidene of the formula —C($R^c$)($R^d$)— wherein $R^c$ and $R^d$ are each independently hydrogen or $C_{1-10}$ alkyl, or a group of the formula —C(=$R^e$)— wherein $R^e$ is a divalent $C_{1-10}$ hydrocarbon group. Exemplary $X^b$ groups include methylene, ethylidene, neopentylidene, and isopropylidene. The bridging group $X^b$ and the carbonate oxygen atoms of each $C_6$ arylene group can be disposed ortho, meta, or para (preferably para) to each other on the $C_6$ arylene group.

In a specific embodiment, $R^e$ and $R^f$ are each independently a $C_{1-3}$ alkyl group, a and b are each independently 0 to 1, and $X^b$ is a single bond, —O—, —S(O)—, —S(O)$_2$—, —C(O)—, a $C_{1-9}$ alkylidene of formula —C($R^c$)($R^d$)— wherein $R^c$ and $R^d$ are each independently hydrogen or $C_{1-8}$ alkyl, or a group of the formula —C(=$R^e$)— wherein $R^e$ is a divalent $C_{1-9}$ hydrocarbon group. In another specific embodiment, $R^e$ and $R^f$ are each independently a methyl group, a and b are each independently 0 to 1, and $X^b$ is a single bond, a $C_{1-7}$ alkylidene of formula —C($R^c$)($R^d$)— wherein $R^c$ and $R^d$ are each independently hydrogen or $C_{1-6}$ alkyl. In an embodiment, a and b is each 1, and $R^e$ and $R^f$ are each a $C_{1-3}$ alkyl group, preferably methyl, disposed meta to the oxygen on each ring. The bisphenol carbonate units (5) can be derived from bisphenol A, where a and b are both 0 and $X^b$ is isopropylidene.

The polycarbonate terpolymers comprise 5 mol % to 30 mol % of the first repeating units, 2 mol % to 50 mol % of the second repeating units, and 45 mol % to 70 mol % of the third repeating units, each based on the sum of moles of the first repeating units, second repeating units, and third repeating units. In specific embodiments, the polycarbonate terpolymers comprise 3 mol % to 28 mol % of the first repeating units, 4 mol % to 20 mol % of the second repeating units, and 50 mol % to 65 mol % of the third repeating units, each based on the sum of the moles of the first repeating units, second repeating units, and third repeating units.

The polycarbonate terpolymers can have a weight average molecular weight of 10,000 to 50,000 Daltons, preferably 18,000 to 25,000 Daltons, as measured by gel permeation chromatography (GPC), using a crosslinked styrene-divinylbenzene column and calibrated to bisphenol A homopolycarbonate references. GPC samples are prepared at a concentration of 1 mg per ml, and are eluted at a flow rate of 1.5 ml per minute.

In an embodiment, the polycarbonate terpolymers have flow properties useful for the manufacture of thin articles. Melt volume flow rate (often abbreviated MVR) measures the rate of extrusion of a thermoplastic through an orifice at a prescribed temperature and load. Polycarbonate terpolymers useful as compatibilization agents for the formation of thin articles can have an MVR of 10 to 35 cm³/10 minutes, more preferably 15 to 25 cm³/10 minutes, measured at 330° C. under a load of 2.16 kg in accordance with ASTM D1238-04.

The polycarbonate terpolymers have a high glass transition temperature (Tg). The Tg of the polycarbonate terpolymers is 175 to 220° C., more preferably 196 to 204° C., determined by differential scanning calorimetry (DSC) as per ASTM D3418 with a 20° C./min heating rate.

The polycarbonate terpolymers can have high heat resistance. The heat deflection temperature (HDT) of the polycarbonate terpolymers is 175 to 200° C., more preferably 181 to 186° C., measured flat on a 80×10×4 mm bar with a 64 mm span at 0.45 MPa according to ISO 75/Bf.

The polycarbonate terpolymers can have high Vicat softening temperature. In an embodiment, the phthalimidine copolycarbonates have a Vicat B120 of 175 to 220° C., preferably 185 to 195° C., measured according to ISO 306.

The polycarbonate terpolymers can have excellent metallization properties. In an embodiment, a metalized sample of the polycarbonate terpolymers has a defect onset temperature that is within 20 degrees Celsius of the heat deflection temperature of the copolycarbonate where the HDT is measured flat on a 80×10×4 mm bar with a 64 mm span at 0.45 MPa according to ISO 75/Bf. In another embodiment, a metalized sample of the polycarbonate terpolymers has a defect onset temperature that is within 10 degrees Celsius of the heat deflection temperature of the copolycarbonate where the HDT is measured flat on a 80×10×4 mm bar with a 64 mm span at 0.45 MPa according to ISO 75/Bf.

The polycarbonate terpolymers can have improved hydrolytic stability as compared to copolycarbonates comprising the first and third repeating units but not the second repeating units. In an embodiment, the phthalimidine copolycarbonates have less than 10% or less than 8% molecular weight loss (Mw loss) after aging at 75° C. for 120 hours.

The polycarbonate terpolymers can have a visual transmission (Tvis) of 80% to 90% measured on HAZE-GUARD plus from BYK-Gardner instruments.

The polycarbonate terpolymers can further have a Notched Izod Impact of 5 to 10 KJ/m², determined in accordance with ISO 180 under a load of 5.5 J at 23° C. on a sample plaque of 3 mm thickness.

The polycarbonate terpolymers can be used as compatibilization agents for certain second polycarbonates. The second polycarbonates can have two, rather than three different types of carbonate units. For example, the second polycarbonate can include a first copolycarbonate consisting of bisphenol A carbonate units and additional carbonate units of formula (1). Alternatively or in addition, the second polycarbonates can include a second copolycarbonate consisting of bisphenol A carbonate units and additional carbonate units of formula (2), (3), (4), (16), or (17). Examples of such second polycarbonates include copolycarbonates comprising bisphenol A carbonate units and 2-phenyl-3,3'-bis(4-hydroxyphenyl) phthalimidine carbonate units (a BPA-PPPBP copolymer, commercially available under the trade name XHT from SABIC) and a copolymer comprising bisphenol A carbonate units and 1,1-bis(4-hydroxyphenyl)-3,3,5-trimethylcyclohexane bisphenol carbonate units. The thermoplastic composition can contain two or more copolycarbonates different from the polycarbonate terpolymer.

By choosing the appropriate monomers for the repeating units described herein, polycarbonates can be manufactured by processes such as interfacial polymerization and melt polymerization. General conditions for interfacial polymerization and melt polymerization are described, for example, in WO 2013/175448 A1 and WO 2014/072923 A1. An end-capping agent (also referred to as a chain stopper agent or chain terminating agent) can be included during polymerization to provide end groups, for example monocyclic phenols such as phenol, p-cyanophenol, and $C_1$-$C_{22}$ alkyl-substituted phenols such as p-cumyl-phenol, resorcinol monobenzoate, and p- and tertiary-butyl phenol, monoethers of diphenols, such as p-methoxyphenol, monoesters of diphenols such as resorcinol monobenzoate, functionalized chlorides of aliphatic monocarboxylic acids such as acryloyl chloride and methacryoyl chloride, and mono-chloroformates such as phenyl chloroformate, alkyl-substituted phenyl chloroformates, p-cumyl phenyl chloroformate, and toluene chloroformate. Combinations of different end groups can be used. Branched polycarbonate blocks can be prepared by adding a branching agent during polymerization, for example trimellitic acid, trimellitic anhydride, trimellitic trichloride, tris-p-hydroxyphenylethane, isatin-bis-phenol, tris-phenol TC (1,3,5-tris((p-hydroxyphenyl) isopropyl)benzene), tris-phenol PA (4(4(1,1-bis(p-hydroxyphenyl)-ethyl) alpha, alpha-dimethyl benzyl) phenol), 4-chloroformyl phthalic anhydride, trimesic acid, and benzophenone tetracarboxylic acid. The branching agents can be added at a level of 0.05 to 2.0 wt. %. Combinations comprising linear polycarbonates and branched polycarbonates can be used.

The thermoplastic compositions can be prepared by making the polycarbonate terpolymer and the second polycarbonate separately then combine them together. The relative amounts of the polycarbonate terpolymer and the second polycarbonate will depend on the desired physical properties of the compatibilized composition, processing parameters, and like considerations. In an embodiment, the thermoplastic compositions comprise 5 to 90 wt. % of the polycarbonate terpolymer and 10 to 95 wt. % of the second copolycarbonate. In another embodiment, the thermoplastic compositions comprise 20 to 70 wt. % of the polycarbonate terpolymer and 30 to 80 wt. % of the second copolycarbonate. All of the foregoing wt. % values are based on the combined weight of the polycarbonate terpolymer and the second polycarbonate.

Alternatively, the thermoplastic compositions can be formed by melt blending a polymer composition comprising a first copolycarbonate consisting of bisphenol A carbonate units and additional carbonate units of formula (1) and a second copolycarbonate consisting of bisphenol A carbonate units and additional carbonate units of formula (2), (3), (4), (16), or (17) under conditions that provide for transesterification. Without being bound by theory, it is believed that under these conditions, a "mixed monomer" unit is formed, i.e., a unit comprising the additional carbonate unit of formula (1) derived from the first copolycarbonate and an additional carbonate unit derived from the second copolycarbonate, which can compatibilize the blend. In some embodiments the terpolymer as described above can be formed in situ, which can compatibilize the blend. Often transesterification catalysts are useful for providing for or increasing the rate of transesterification. The polymer composition comprises, based on the total weight of the polymer composition, 5 wt. % to 95 wt. % of the first copolycarbonate and 95 wt. % to 5 wt % of the second copolycarbonate. The weight ratio of the first polycarbonate relate to the second polycarbonate can be 95:5 to 5:95, 1:10 to 10:1, 1:4 to about 4:1, or about 2:3 to 3:2.

Suitable transesterification catalysts include a wide variety of bases and Lewis acids. Specific examples of some transesterification catalysts include tetraorganophosphonium hydroxides, tetraorganophosphonium carbonates, tetraorganophosphonium acetates, tetraorganophosphonium phenolates, tetraorganophosphonium bisphenolates, tetraorganoammonium hydroxides, tetraorganoammonium carbonates, tetraorganoammonium phosphites, tetraorganoammonium acetates, tetraorganoammonium phenolates, and tetraorganoammonium bisphenolates, wherein each organic group is the same or different, and is an unsubstituted or substituted $C_{1-10}$ alkyl, $C_{3-10}$ cycloalkyl, $C_{6-24}$ aryl, $C_{7-25}$ alkylaryl, or $C_{7-25}$ arylalkyl. Exemplary substituents include halogen; cyano; hydroxyl; nitro; $C_{1-6}$ alkyl groups; $C_{3-6}$ cycloalkyl groups; $C_{1-6}$ alkoxy groups; $C_{6-12}$ aryloxy such as phenoxy; $C_{1-6}$ aminoalkyl groups; $C_{6-12}$ aryl (e.g., phenyl, biphenyl, naphthyl, or the like, each ring being either a substituted or an unsubstituted aromatic); $C_{7-18}$ arylalkyl having 1 to 3 separate or fused rings (e.g., benzyl); or $C_{7-18}$ alkylaryl having 1 to 3 separate or fused rings. Combinations comprising at least one of the foregoing catalysts can also be used. A specific class of transesterification catalyst includes a tetraorganophosphonium hydroxide, acetate, or phenolate that is decomposable under reaction conditions to very low levels of the active catalytic species, wherein each organic group is the same or different, and is a substituted or unsubstituted $C_{1-10}$ alkyl, $C_{6-18}$ aryl, $C_{7-25}$ alkylaryl, or $C_{7-25}$ arylalkyl, wherein the substituent(s) (if present) are as described above. In one embodiment, each organo group is the same and is an unsubstituted $C_{1-10}$ alkyl, $C_{6-12}$ aryl, $C_{7-13}$ alkylaryl, or $C_{7-13}$ arylalkyl. More preferably, each organo group is the same and is an unsubstituted $C_{1-6}$ alkyl, $C_{6-10}$ aryl, $C_{7-10}$ alkylaryl, or $C_{7-10}$ arylalkyl. The transesterification catalyst can be a tetra $C_{1-6}$ alkyl phosphonium hydroxide, a tetra $C_{1-6}$ alkyl phosphonium phenoxide, or a combination comprising at least one of the foregoing catalysts. Most preferably, the catalyst is tetrabutylphosphonium hydroxide (TBPH). The transesterification catalyst is present in sufficient amount to compatibilize the first copolycarbonates and the second copolycarbonates, and thus provide the desired balance of properties, including transparency, metal adhesion, defect onset temperature, but is not present in an excessive amount, because an excess can produce brittle, low molecular weight reaction product or a much more yellow, unstable reaction product.

The optimal catalyst level will vary depending on the particular types of polymers and catalyst. In an embodiment, a transesterification catalyst can be used in amounts of 0.001% to 0.1%, or 10 to 1000 ppm of the polymer composition comprising the first and second copolycarbonates. In another embodiment, the amount of transesterification catalyst is 10 to 220 ppm, preferably 20 to 200 ppm, more preferably 30 to 180 ppm of the polymer composition comprising the first and second copolycarbonates.

The thermoplastic or compatibilized compositions can further comprise a polycarbonate homopolymer such as a bisphenol A homopolycarbonate. The polycarbonate homopolymer can be present in an amount of 10 wt % to 60 wt %, based on the total weight of the thermoplastic composition.

The thermoplastic compositions can include various additives ordinarily incorporated into polymer compositions of this type, with the proviso that the additive(s) are selected so as to not significantly adversely affect the desired properties of the thermoplastic composition, in particular melt flow, thermal, transparency, and surface properties. Such additives can be mixed at a suitable time during the mixing of the components for forming the composition. Additives include fillers, reinforcing agents, antioxidants, heat stabilizers, light stabilizers, ultraviolet (UV) light stabilizers, plasticizers, lubricants, mold release agents, antistatic agents, colorants such as such as titanium dioxide, carbon black, and organic dyes, surface effect additives, radiation stabilizers, flame retardants, and anti-drip agents. A combination of additives can be used, for example a combination of a heat stabilizer, mold release agent, and ultraviolet light stabilizer. In general, the additives are used in the amounts generally known to be effective. For example, the total amount of the additives (other than any impact modifier, filler, or reinforcing agents) can be 0 to 5 wt. % or 0.01 to 5 wt. %, based on the total weight of the thermoplastic composition. The thermoplastic compositions can be manufactured by various methods known in the art. For example, powdered polycarbonate, and other optional components are first blended, optionally with any fillers, in a high speed mixer or by hand mixing. The blend is then fed into the throat of a twin-screw extruder via a hopper. Alternatively, at least one of the components can be incorporated into the composition by feeding it directly into the extruder at the throat or downstream through a sidestuffer, or by being compounded into a masterbatch with a desired polymer and fed into the extruder. The extruder is generally operated at a temperature higher than that necessary to cause the composition to flow. The extrudate can be immediately quenched in a water bath and pelletized. The pellets so prepared can be one-fourth inch long or less as desired.

Such pellets can be used for subsequent molding, shaping, or forming.

The thermoplastic or compatibilized compositions can have an MVR of 5 to 30, more preferably 18 to 28 cm$^3$/10 minutes, measured at 330° C. under a load of 2.16 kg in accordance with ASTM D1238-04.

The thermoplastic or compatibilized compositions can have a heat deflection temperature (HDT) of 160 to 195° C., measured flat on a 80×10×4 mm bar with a 64 mm span at 0.45 MPa according to ISO 75/Bf.

The thermoplastic or compatibilized compositions can have excellent metallization properties. In an embodiment, a metalized sample of the thermoplastic composition has a defect onset temperature that is within 20 degrees Celsius of the heat deflection temperature of the thermoplastic composition where the HDT is measured flat on a 80×10×4 mm bar with a 64 mm span at 0.45 MPa according to ISO 75/Bf.

In another embodiment, a metalized sample of the thermoplastic composition has a defect onset temperature that is within 10 degrees Celsius of the heat deflection temperature of the thermoplastic composition where the HDT is measured flat on a 80×10×4 mm bar with a 64 mm span at 0.45 MPa according to ISO 75/Bf.

The thermoplastic or compatibilized compositions can have excellent transparency. In an embodiment, the thermoplastic or compatibilized compositions have a haze less of less than 15% and a transmission greater than 75%, each measured using the color space CIE1931 (Illuminant C and a 2° observer) at a 3.2 mm thickness.

Shaped, formed, or molded articles comprising the thermoplastic or compatibilized compositions are also provided. The compositions can be molded into useful shaped articles by a variety of methods, such as injection molding, extrusion, rotational molding, blow molding, and thermoforming. Some example of articles include computer and business machine housings such as housings for monitors, handheld electronic device housings such as housings for cell phones, electrical connectors, and components of lighting fixtures, ornaments, home appliances, roofs, greenhouses, sun rooms, swimming pool enclosures, and the like. Additional exemplary articles include a plug, a plug housing, a switch, an electrical conductor, a connector, an electric board, a lamp holder, a lamp cover, a lamp bezel, a reflector, a signal indicator, glazing, a lens, a lens holder, a waveguide element, a collimator, a light emitting diode, a diffuser sheet, a safety pane, a film, a film laminate, a safety goggle, and a visor.

The article comprising the thermoplastic or compatibilized compositions can be a metallized article. The metallized article comprises, for example, a substrate comprising the compatibilized thermoplastic compositions, with a metal layer disposed on the at least one side of the substrate.

The substrate can be for example, a film. The substrate can be made by molding the thermoplastic or compatibilized compositions. The molding methods are not particularly limited, and various known molding methods can be listed, for example, injection molding, gas assist injection molding, vacuum molding, extrusion, compression molding, calendaring, rotary molding, etc. Of these, molding is usually carried out by injection molding.

The metal layer can be disposed onto the surface of the substrate with the aid of electrocoating deposition, physical vapor deposition, or chemical vapor deposition or a suitable combination of these methods. Sputtering processes can also be used. The metal layer resulting from the metallizing process (e.g., by vapor deposition) can be 0.001 to 50 micrometers (am) thick.

A base coat can be present between the substrate and the metal layer.

However, it is advantageous to form the metal layer directly on the substrate surface without forming an undercoat. The surfaces of the substrate are smooth and good gloss can be obtained even by direct metal vapor deposition without treating the substrate with primer. Moreover, the release properties of the molded substrate during injection molding are good. Accordingly, the surface properties of the molded substrate are superior without replication of mold unevenness.

Chrome, nickel, aluminum, etc. can be listed as examples of vaporizing metals. Aluminum vapor deposition is used in one embodiment as metal vapor deposition. The surface of the molded substrate can be treated with plasma, cleaned, or degreased before vapor deposition in order to increase adhesion.

The metallized article can have a protective layer disposed on the metal layer. "Protective layer" refers for example, to a layer which is made of a binder or a high molecular weight polymer and formed on the outermost (e.g., the UV blocking) layer, so as to exert the effects of preventing marring and improving mechanical properties of the multilayer article. The protective layer can be clear or pigmented and be formulated, for example, with nitrocellulose or synthetic polymers configured to quickly dry by evaporation without chemical reaction with the layer on which they are disposed, providing a solid protective layer. The protective coating material can further be thinned with alcohols. In certain applications, the thickness of the protective layer is minimized. The thickness of the protective layer can be, for example, 0.2 am or less.

The metallized articles can have little mold shrinkage, have good surface gloss even when metal layers are directly vapor deposited, and the vapor deposited surfaces do not become cloudy or have rainbow patterns even on heating of the vapor deposited surface. In particular, the metallized article can have no surface defects visible to the eye.

Illustratively, the metallized article has a metallized surface, wherein the surface can exhibit a gloss of greater than 95 units, or greater than 1700 units, measured at 20 degrees using a trigloss meter. The metallized surface can also retain 85%, 88%, 90%, 95% or more of its gloss after heat aging at 150° C. for 1 hour, measured at 20 degrees using a micro trigloss meter. A base coat (undercoat) can be present between the article and the metallized surface, or a surface of the article can be directly metallized.

Metallized articles have applications in optical reflectors and can be used for automotive headlamps, headlight extensions, and headlamp reflectors, for indoor illumination, for vehicle interior illumination for projector lamps, for electronic flash reflectors, for camera flash reflectors and for the like.

EXAMPLES

The polymers used in the Examples are described in Table 1A.

TABLE 1A

| Component | Chemical Description (mol %) | Mw | Tg (° C.) | Source |
|---|---|---|---|---|
| TerPC1 | 5-30-65 BPI-PPP-BPA | 22,600 +/− 500 | 199 | SABIC |
| TerPC2 | 15-25-60 BPI-PPP-BPA | 22,600 +/− 500 | 200 | SABIC |
| TerPC3 | 29.5-16.5-54 BPI-PPP-BPA | 22,600 +/− 500 | 200 | SABIC |
| TerPC4 | 44-8-48 BPI-PPP-BPA | 22,600 +/− 500 | 201 | SABIC |
| BPI-CoPC | 57-0-43 BPI-PPP-BPA | 22,600 +/− 500 | 200 | SABIC |
| PPPBP-CoPC | 0-33-67 BPI-PPP-BPA | 22,600 +/− 500 | 195 | SABIC |
| PC1 | 0-0-100 BPI-PPP-BPA | 18800 +/− 500 | 143 | SABIC |
| APEC 2097 | | | | COVESTRO |

In Table 1A, BPI refers to 1,1-bis-(4-hydroxyphenyl)-3,3,5-trimethylcyclohexane carbonate units, PPP refers to N-phenyl phenolphthalein bisphenol carbonate units, and BPA refers to bisphenol A carbonate units.

The additives used in the Examples are described in Table 1B.

TABLE 1B

| | | |
|---|---|---|
| Hindered phenol | Octadecyl-3-(3,5-di-tert-butyl-4-hydroxyphenyl) propionate | BASF |
| Phosphite stabilizer | Tris(di-t-butylphenyl)phosphite | BASF |
| Mold release agent | Palmitic/stearic acid (50/50) ester of dipenta/pentaerythritol | Emery Oleochemicals |
| Catalysts | Tetrabutylphosphonium hydroxide (TBPH) | Emery Oleochemicals |

Blending, Extrusion, and Molding Conditions

The compositions were made as follows. All solid were dry blended off-line as concentrates using one of the primary polymer powders as a carrier and starve-fed via gravimetric feeder(s) into the feed throat of the extruder. The remaining polymer(s) were starve-fed via gravimetric feeder(s) into the feed throat of the extruder as well. The liquid additives, if any, were fed before the vacuum using a liquid injection system. It will be recognized by one skilled in the art that the method is not limited to these processing steps or processing equipment.

The transesterification catalyst can be blended with one or both of the polycarbonate powders in a mixer prior to extrusion, or it can be fed, e.g., as an aqueous solution, concomitantly down the throat of the extruder or downstream of the throat. The catalyst can be fed using a metering pump or by a calibrated gravity fed drip. The catalyst can be added diluted in a solvent such as water, at a concentration of 1 to 50 wt % of the solution.

Extrusion of all materials was performed on a 25 mm Werner-Pfleiderer ZAK twin-screw extruder (L/D ratio of 33/1) with a vacuum port located near the die face. The extruder has 9 zones, which were set at temperatures of 40° C. (feed zone), 200° C. (zone 1), 250° C. (zone 2), 270° C. (zone 3) and 280-300° C. (zone 4 to 8). Screw speed was 300 rpm and throughput was between 15 and 25 kg/hr. It will be recognized by one skilled in the art that the method is not limited to these temperatures or processing equipment.

The compositions were molded after drying at 100-110° C. for 6 hours on a 45-ton Engel molding machine with 22 mm screw or 75-ton Engel molding machine with 30 mm screw operating at a temperature 270-300° C. with a mold temperature of 70-90° C. It will be recognized by one skilled in the art that the method is not limited to these temperatures or processing equipment.

Testing Methods.

Weight average molecular weight (Mw) determinations were performed using GPC using a cross linked styrene-divinyl benzene column, at a sample concentration of 1 milligram per milliliter, and as calibrated with bisphenol A homopolycarbonate standards. Samples were eluted at a flow rate of 1.0 ml/min with methylene chloride as the eluent.

The hydrolytic stability was measured in a homogeneous solution at elevated temperature (75° C.) over 120 hrs as follows: a solution of 1 gram of the polymer in 16 mL of 1,2-dichloroethane was prepared in a 2-ounce bottle. From this solution was taken 10-15 drops, which were added to 10 mL of methylene chloride containing toluene as an internal standard. The Mw of this material was obtained and used as the time zero sample. To the remaining 1,2-dichloroethane polymer solution was added a solution of 25 μL of DI water in 3.11 mL of methyl ethyl ketone. The sample was then placed in an oven at 75° C. for 120 hrs. After this time the Mw of the polymer was again measured and the results were reported as the percentage of Mw loss based on the time zero sample.

Metallization was performed on molded parts from a film gate injection set-up having dimensions 60 mm×60 mm and a thickness of either 3 mm or 1.5 mm using the physical vapor deposition (PVD) process. The process deposited a 100 to 150 nm thick aluminum layer onto one side of the molded part under vacuum, followed by a protective plasma-deposited siloxane hard-coat of 50 nm. The initial metallization performance was assessed by two well-trained operators as acceptable ("OK") or not acceptable ("NOK").

"Defect onset temperature" (DOT) was determined as the highest temperature at which no visual defects appeared on a metallized sample after 1 hour of heat aging in an air circulating oven, exposing all sides of the sample (symmetric heating). The thermal treatment of the metallized samples was carried out at least 48 hours after the parts were metallized.

The reflection data of the metallized articles and the heat treated metallized articles was acquired on an X-rite I-7 spectrophotometer according to ASTM D1003-00 using a 25 mm aperture under D65 illumination in specular reflection mode and 10 degrees Celsius observer.

Visual defects were measure by eye with a trained operator and by an increase in L*. There are two common modes of failure during thermal treatment of the metallized parts. The parts can become hazy with the result that these parts exhibit an increase in diffuse reflection, which can be measured as an increase in L* when the parts are measured in reflection mode under specular excluded conditions. The parts can also fail due to blistering, which may not give a significant increase in diffuse reflection but is determined by close inspection of the parts. Hence a failure is reported as "defect onset temperature" (DOT) and captures the temperature at which the heat treated part fails at least the visual assessment or gives a high diffuse scattering i.e. high L* in specular reflection mode.

Tensile properties were measured in accordance with ISO 527 at 50 mm/min at room temperature on standard ISO tensile bars.

Notched Izod impact Strength ('INI') was determined in accordance with ISO 180 under a load of 5.5 J, at different temperatures including a temperature of 23° C. or −30° C. ISO INI determinations were carried out on sample plaques of 3 mm thickness.

Melt volume rate ("MVR") was determined in accordance with ASTM D1238-04 under a load of 2.16 kg at 330° C.

Glass transition temperature (Tg) was determined by differential scanning calorimetry (DSC) as per ASTM D3418 with a 20° C./min heating rate.

Vicat B value was determined according to ISO 306, Method B120.

Heat deflection temperature (HDT) was determined on a flat 80×10×4 mm bar with a 64 mm span according to ISO 75/Bf, at the pressures indicated.

Haze and transmission measurement by HazeGard (ASTM D1003-00) used injection molded samples of 3.2 mm thickness.

Visible transmission (Tvis) measurements were acquired on HAZE-GUARD plus from BYK-Gardner instruments. Visible transmission was determined by measuring haze in accordance with ASTM D-1003-00, Procedure A using an integrating sphere (0°/diffuse geometry), wherein the spectral sensitivity conforms to the Commission Internatinale de L'Eclairage) (CIE, 1931) standard spectral value under standard lamp D65.

Polymers Preparation

Preparation of TerPC1

To a mixture of methylene chloride (22 L), DI water (9 L), BPA (2379 g, 10.42 mol), BPI (248.8 g, 0.8016 mol), p-cumylphenol (149.7 g, 0.8016 mol), triethylamine (30 ml), and sodium gluconate (10 g) in a 75-L reactor equipped with mechanical stirring, recirculation line with pH probe, sub-surface phosgene addition, chilled glycol condenser, caustic scrubber for exit gas, and caustic solution inlet was added at 70 g/min a solution of PPPBP (1891 g, 4.81 mol) in 1224 g of 33% NaOH and 3190 g of DI water while phosgene (2350 g, 23.7 mol) was added at 80 g/min. Aqueous caustic (33 wt %) was added as needed to maintain pH of 8 to 9 in the reactor. After 2698 g (27.3 mol) of phosgene was added, the reactor was then purged with nitrogen. A sample was pulled for GPC analysis. The material was rephosgenated again (for a total of 2904 g) and the Mw was determined. The process was repeated until the Mw increase was less than about 200 Daltons. The polymer mixture was transferred to the 100-L work-up tank. It was purified on a centrifuge train where the brine phase was separated and the polymer solution in methylene chloride was extracted with aqueous HCl and then washed with deionized water until titratable chlorides were less than 5 ppm. The polymer solution was then steam precipitated and the resultant polymer dried under hot nitrogen until volatile levels were <0.4 wt %. The Mw of the dried polymer was 22,600+/−500.

Preparation of TerPC2 to TerPC4

TerPC-2 through 4 were prepared according a similar procedure as described for TerPC-1 in Example 1 by adjusting the monomer ratios, endcap levels, and reagents accordingly.

Preparation of BPI/BPA Copolymer with 57 Mol % BPI

To a mixture of methylene chloride (22 L), DI water (9 L), BPA (1609 g, 7.05 mol), BPI (2901 g, 9.34 mol), p-cumyl-phenol (146.0 g, 0.6967 mol), triethylamine (30 ml), and sodium gluconate (10 g) in a 75 L reactor equipped with mechanical stirring, recirculation line with pH probe, subsurface phosgene addition, chilled glycol condenser, caustic scrubber for exit gas, and caustic solution inlet was added phosgene (2699 g, 27.3 mol) at 80 g/min. Aqueous caustic (33 wt %) was added as needed to maintain pH of 8-9 in the reactor. After the phosgene was added, the reactor was then purged with nitrogen. A sample was pulled for GPC analysis. The material was rephosgenated again (to a total of 2903 g) and the Mw was determined. The process was repeated until the Mw increase was less than about 200 Daltons. The polymer mixture was transferred to the 100-L work-up tank. It was purified on a centrifuge train where the brine phase was separated and the polymer solution in methylene chloride was extracted with aqueous HCl and then washed with deionized water until titratable chlorides were less than 5 ppm. The polymer solution was then steam precipitated and the resultant polymer dried under hot nitrogen until volatile levels were <0.4 wt %. The Mw of the dried polymer was 22,600+/−500.

Comparative Examples 1-6

Terpolymers and BPI-coPC, PPPBP-coPC copolymers were tested for Tvis, haze, and MVR. The compositions were also evaluated as metalized reflectors. Results are shown in Table 2 and FIG. 1.

TABLE 2

| Component | Unit | CEx 1 | CEx 2 | CEx 3 | CEx 4 | CEx 5 | CEx 6 |
|---|---|---|---|---|---|---|---|
| TerPC1 | Wt % | | 100 | | | | |
| TerPC2 | Wt % | | | 100 | | | |
| TerPC3 | Wt % | | | | 100 | | |
| TerPC4 | Wt % | | | | | 100 | |
| BPI-coPC | Wt % | | | | | | 100 |
| PPPBP-coPC | Wt % | 100 | | | | | |
| BPI | Mol % | 0 | 5 | 15 | 30 | 44 | 57 |
| PPPBP | Mol % | 33 | 30 | 25 | 16.5 | 8 | 0 |
| BPA | Mol % | 67 | 65 | 60 | 54 | 48 | 43 |
| Tvis (3.2 mm data) | expected | 86 | 81 | 85 | 87 | 89 | 88 |
| MVR 330° C./2.16 kg (300 sec) | cc/10' | 31 | 23 | 23 | 24 | 19 | 23 |
| Tg, ° C., at 20° C./min | | 195 | 198 | 199 | 199 | 200 | 200 |
| Vicat (B 120) | ° C. | 186 | 188 | 189 | 190 | 192 | 192 |
| HDT (0.45 MPa) | ° C. | 180 | 182 | 183 | 184 | 185 | 184 |
| IZOD 3 mm | kJ/m$^2$ | 8 | 8 | 7 | 5 | 5 | 6 |
| 1.5 mm - metallized plaques | | | | | | | |
| DOT | ° C. | 175 | 175 | 175 | 175 | 165 | <165 |
| Heat treated at 165° C. | P/F | — | — | — | — | P | Bubbles |
| Heat treated at 170° C. | P/F | — | P | P | P | Bubbles | Bubbles |
| Heat treated at 175° C. | P/F | P | P | P | P | — | — |
| Heat treated at 180° C. | P/F | F | F | Bubbles | Bubbles | Bubbles | Bubbles |
| Delta HDT (0.45 MPa) - DOT | ≤20° C. | Yes ≤10° C. | Yes ≤10° C. | Yes ≤10° C. | Yes ≤10° C. | Yes ≤20° C. | No >20° C. |
| Metallized plaque before heat ageing | L* | 5 | 5 | 5 | 4 | 4 | 5 |
| Heat treated at 165° C. | L* | — | — | — | — | 4 | 15 |
| Heat treated at 170° C. | L* | — | 5 | 9 | 4 | 14 | 27 |
| Heat treated at 175° C. | L* | 9 | 4 | 7 | 4 | — | — |
| Heat treated at 180° C. | L* | 68 | 72 | 61 | 16 | 19 | 43 |

*Each of the compositions in Table 2 contained hindered phenol, phosphite stabilizer, and the mold releasing agent.

The data in Table 2 shows that PPPBP-coPC has a defect onset temperature (DOT) within 10° C. of its HDT (0.45 MPa). In addition, the DOT values of the terpolymers are within 10-20° C. of their HDT (0.45 MPa). In contrast, the BPI-coPC has a DOT that is greater than 20° C. below its HDT. Thus the usefulness of the BPI-coPC is being hampered by its lack of adhesion to metal.

Comparative Examples 7-12

The physical properties of BPI/BPA copolymer and PPPBP/BPA copolymer blends have been tested. The results are shown in Tables 3 and 4 and FIG. 2.

provide parts with high gloss, class A surfaces. The parts made from two phase blends typically have swirls and flow lines in the surface which result from molding conditions and part gating. These imperfections can show up in the metallized surface. In addition, these imperfections make it difficult to detect imperfections in the surface of the part until after it is metallized which creates higher yield losses.

TABLE 3

| Component | Unit | CEx 7 | CEx 8 | CEx 9 | CEx 10 | CEx 11 | CEx 12 |
|---|---|---|---|---|---|---|---|
| BAYER 2097 | Wt % | | 9 | 26 | 53 | 77 | 100 |
| PPPBP-coPC | Wt % | 100 | 91 | 74 | 47 | 23 | |
| BPI | Mol % | 0 | 5 | 15 | 30 | 44 | 57 |
| PPPBP | Mol % | 33 | 30 | 24 | 15.5 | 8 | 0 |
| BPA | Mol % | 67 | 65 | 61 | 54 | 48 | 43 |
| Properties | | | | | | | |
| MVR 330° C./2.16 kg (300 sec) | cc/10' | 32 | 27 | 20 | 10 | 12 | 9 |
| MVR 330° C./2.16 kg (1080 sec) | cc/10' | 24 | 24 | 25 | 13 | 19 | 11 |
| Vicat B 120 (330° C.) | ° C. | 188 | 188 | 191 | 193 | 194 | 197 |
| HDT 0.45 MPa/Flat (330° C.) | ° C. | 180 | 181 | 183 | 185 | 186 | 186 |
| HDT 1.8 MPa/Flat (330° C.) | ° C. | 165 | 165 | 170 | 169 | 170 | 170 |
| IZOD 3 mm | kJ/m2 | 8 | 9 | 7 | 7 | 6 | 6 |
| Transmission-Haze (3.2 mm Disks) | | | | Molding: 330° C. | | | |
| Transmission | % | 89 | 86 | 41 | 15 | 27 | 88 |
| Haze | % | 0.4 | 4.3 | 93 | 103 | 103 | 1.5 |
| 1.5 mm - metallized plaques | | | | | | | |
| DOT | ° C. | 175 | — | — | 170 | 170 | <170 |
| Heat treated at 170° C. | P/F | — | — | — | P | P | Bubbles |
| Heat treated at 175° C. | P/F | P | — | — | Bubbles | Bubbles | Bubbles |
| Heat treated at 180° C. | P/F | Haze | — | — | — | — | Bubbles |
| Delta HDT (0.45 MPa) - DOT | ≤10° C. | Yes | — | — | No | No | No |
| Metallized plaque before heat ageing | L* | 5 | — | — | 5 | 5 | 4 |
| Heat treated at 170° C. | L* | — | — | — | 7 | 10 | — |
| Heat treated at 175° C. | L* | 9 | — | — | 9 | 20 | 4 |
| Heat treated at 180° C. | L* | 68 | — | — | — | — | 4 |

*Each of the compositions in Table 3 contained hindered phenol, phosphite stabilizer, and the mold releasing agent.

TABLE 4

| Component | Unit | CEx 7a | Ex 8a | Ex 9a | CEx 10a | CEx 11a | CEx 12a |
|---|---|---|---|---|---|---|---|
| BAYER 2097 | Wt % | | 9 | 26 | 53 | 77 | 100 |
| PPPBP-coPC | Wt % | 100 | 91 | 74 | 47 | 23 | |
| BPI | Mol % | 0 | 5 | 15 | 30 | 44 | 57 |
| PPPBP | Mol % | 33 | 30 | 24 | 15.5 | 8 | 0 |
| BPA | Mol % | 67 | 65 | 61 | 54 | 48 | 43 |
| Properties | | | | Molding: 350° C. | | | |
| Transmission | % | 86 | 88 | 89 | 43 | 40 | 88 |
| Haze | % | 0.7 | 0.7 | 0.8 | 62 | 97 | 2.5 |
| Δ Transmission (330° C.-350° C.) | % | 3 | −1 | −48 | −28 | −13 | 0 |

*Each of the compositions in Table 4 contained hindered phenol, phosphite stabilizer, and the mold releasing agent.

Figure 2:
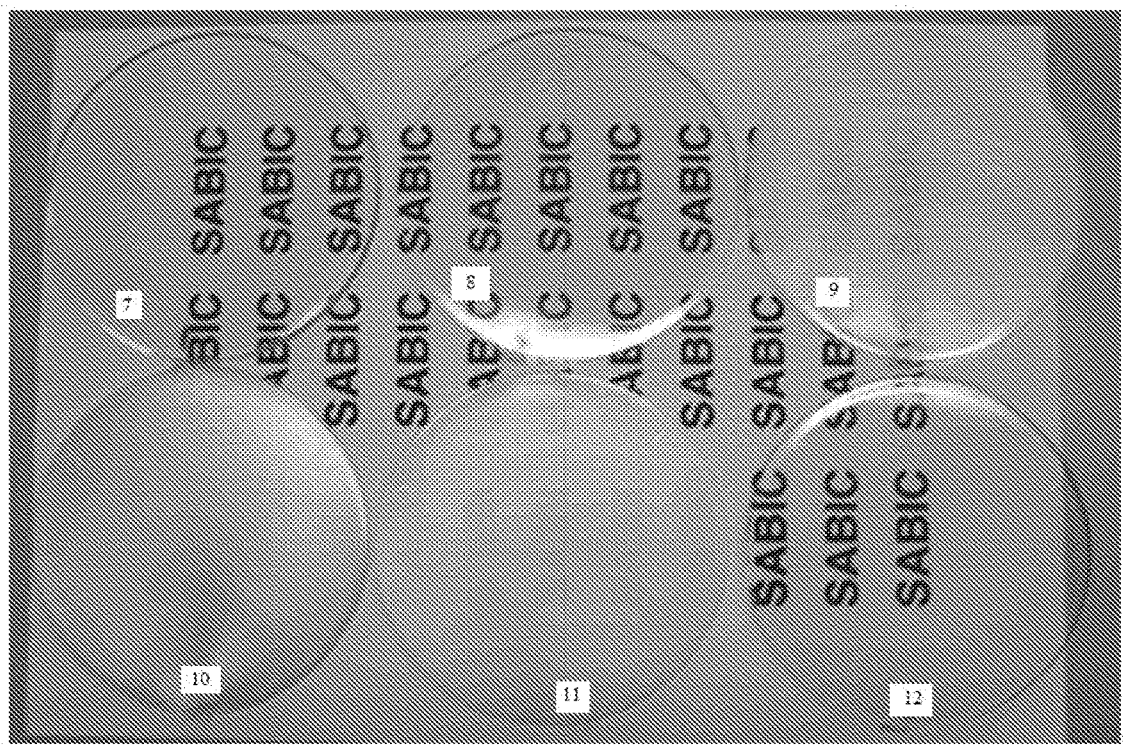
FIG. 2 illustrates the transparency of samples made from the blends of comparative examples 7-12 when molded at 330° C.

As shown in Table 3 and FIG. 2, neat BPI/BPA copolymer, neat PPPBP/BPA copolymer, and a blend thereof containing 9 wt % of BPI/BPA copolymer and 91 wt % of PPPBP/BPA copolymer have high transmission and low haze with a transmission of greater than 85% and a haze of less than 5% when samples are molded at 330° C. However, other blends of BPI/BPA copolymers and PPPBP/BPA copolymers are not compatible and lead to phase separated, hazy compositions. Comparative examples 9-11 have low transparency and high haze with a transparency value of less than 45% and a haze value of greater than 90% when samples are molded at 330° C. Such hazy, two phase systems do not Compatible blends can be prepared by melt mixing copolymers of BPI/BPA and copolymers of PPPBP/BPA at elevated temperatures. Without being bound by theory, it is believed that under these conditions, the terpolymer can be formed in situ, which can compatibilize the blend, and thus improve transparency. Rate of formation of a mixed monomer (a BPI unit adjacent to a PPPPBP unit) can be monitored by nuclear magnetic resonance spectroscopy (NMR), for example. Tables 3 and 4 show that when the incompatible/hazy blends containing 26 wt % BPI/BPA copolymer and 74 wt % of PPPBP/BPA copolymer were molded at 330° C., the transparency value was only 41%. However, when the blend was melt molded at 350° C., conditions more conducive the transesterification, the transparency value increased from 41% (CEx9) to 89% (Ex9a). The transparency values of the blends of comparative examples 10 and 11 also increased when the blends were melt molded at 350° C. instead of 330° C. However, the data suggests that the improvement is not adequate to produce transparent parts across the range of useful compositions.

Set forth below are specific embodiments of the disclosure.

Embodiment 1

A thermoplastic composition comprising: a polycarbonate terpolymer comprising first repeating units, second repeating units different from the first repeating units, and third repeating units different from the first and second repeating units; and wherein the first repeating units are phthalimidine carbonate units of the formula (1) wherein $R^a$ and $R^b$ are each independently a $C_{1-12}$ alkyl, $C_{2-12}$ alkenyl, $C_{3-8}$ cycloalkyl, or $C_{1-12}$ alkoxy, each $R^3$ is independently a $C_{1-6}$ alkyl, $R^4$ is hydrogen, $C_{2-6}$ alkyl or phenyl optionally substituted with 1 to 5 $C_{1-6}$ alkyl groups, p, q, and j are each independently 0 to 4; the second repeating units are carbonate units of the formulas (2), (3), (4), (16), or (17), wherein $R^c$ and $R^d$ are each independently a $C_{1-12}$ alkyl, $C_{2-12}$ alkenyl, $C_{3-8}$ cycloalkyl, or $C_{1-12}$ alkoxy, each $R^6$ is independently $C_{1-3}$ alkyl or phenyl, $X^a$ is a $C_{6-12}$ polycyclic aryl, $C_{3-18}$ mono- or polycycloalkylene, $C_{3-18}$ mono- or polycycloalkylidene, $-(Q^1)_x$-G-$(Q^2)_y$- group wherein $Q^1$ and $Q^2$ are each independently a $C_{1-3}$ alkylene, G is a $C_{3-10}$ cycloalkylene, x is 0 or 1, and y is 1; and m and n are each independently 0 to 4; and the third repeating units are carbonate units of the formula (5) wherein $R^e$ and $R^f$ are each independently $C_{1-12}$ alkyl, $C_{1-12}$ alkenyl, $C_{3-8}$ cycloalkyl, or $C_{1-12}$ alkoxy, a and b are each independently integers of 0 to 4, and $X^b$ is a single bond, —O—, —S—, —S(O)—, —S(O)$_2$—, —C(O)—, or $C_{1-32}$ bridging hydrocarbon group, provided that $X^b$ is not a phthalimidine group or $X^a$; and a second polycarbonate, wherein the second polycarbonate comprises a first copolycarbonate consisting of bisphenol A carbonate units and first additional carbonate units of the formulas (2), (3), (4), (16), or (17), wherein $R^c$ and $R^d$ are each independently a $C_{1-12}$ alkyl, $C_{2-12}$ alkenyl, $C_{3-8}$ cycloalkyl, or $C_{1-12}$ alkoxy, each $R^6$ is independently $C_{1-3}$ alkyl or phenyl, $X^a$ is a $C_{6-12}$ polycyclic aryl, $C_{3-18}$ mono- or polycycloalkylene, $C_{3-18}$ mono- or polycycloalkylidene, $-(Q^1)_x$-G-$(Q^2)_y$- group wherein $Q^1$ and $Q^2$ are each independently a $C_{1-3}$ alkylene, G is a $C_{3-10}$ cycloalkylene, x is 0 or 1, and y is 1; and m and n are each independently 0 to 4; or a second copolycarbonate consisting of bisphenol A carbonate units and second additional carbonate units of the formula (1) wherein $R^a$ and $R^b$ are each independently a $C_{1-12}$ alkyl, $C_{2-12}$ alkenyl, $C_{3-8}$ cycloalkyl, or $C_{1-12}$ alkoxy, each $R^3$ is independently a $C_{1-6}$ alkyl, $R^4$ is hydrogen, $C_{1-6}$ alkyl or phenyl optionally substituted with 1 to 5 $C_{1-6}$ alkyl groups, p, q, and j are each independently 0 to 4, or a combination comprising at least one of the foregoing copolycarbonates, wherein the composition has a haze of less than 15% and a transmission greater than 75%, each measured using the color space CIE1931 (Illuminant C and a 2° observer) at a 3.2 mm thickness.

Embodiment 2

The thermoplastic composition of Embodiment 1, wherein the first repeating units of the polycarbonate terpolymer are phthalimidine carbonate units of the formula (1a) wherein $R^5$ is phenyl.

Embodiment 3

The thermoplastic composition of Embodiment 1 or Embodiment 2, wherein the second repeating units of the polycarbonate terpolymer have the structural formula (2h) wherein each $R^1$ is independently hydrogen or $C_{1-4}$ alkyl, each $R^2$ is independently $C_{1-4}$ alkyl or hydrogen, and g is 0 to 10.

Embodiment 4

The thermoplastic composition of Embodiment 3, wherein $R^1$ is methyl or hydrogen, $R^2$ is methyl or ethyl, and g is 0 to 3.

Embodiment 5

The thermoplastic composition of any one or more of Embodiments 1 to 4, wherein the second repeating units of the polycarbonate terpolymer are 1,1-bis(4-hydroxyphenyl)-3,3,5-trimethyl-cyclohexane carbonate units.

Embodiment 6

The thermoplastic composition of Embodiment 1 or Embodiment 2, wherein the second repeating units of the polycarbonate terpolymer are carbonate units of the formula (2a), (2b), (2c), (2d), (2e), (2f), (2g), or 2(i) wherein $R^c$ and $R^d$ are each independently a $C_{1-12}$ alkyl, $C_{2-12}$ alkenyl, $C_{3-8}$ cycloalkyl, or $C_{1-12}$ alkoxy; and m and n are each independently 0 to 4.

Embodiment 7

The thermoplastic composition of any one of mores of Embodiments 1 to 6, wherein the third repeating units of the polycarbonate terpolymer are bisphenol A carbonate units.

Embodiment 8

The thermoplastic composition of any one or more of Embodiments 1 to 7, wherein the polycarbonate terpolymer comprises 3 mol % to 28 mol % of the first repeating units, 4 mol % to 20 mol % of the second repeating units, and 45 mol % to 70 mol % of the third repeating units, each based on the sum of moles of the first repeating units, second repeating units, and third repeating units.

Embodiment 9

The thermoplastic composition of any one or more of Embodiments 1 to 8, wherein the composition comprises 5 to 90 wt. % of the polycarbonate terpolymer; and 10 to 95 wt. % of the second polycarbonate, each based on the total weight of the thermoplastic composition.

Embodiment 10

A melt-blend composition formed from, based on the total weight of the melt-blend composition, 0 to 5 wt. % of an additive; and 95 to 100 wt. % of a polymer composition, wherein the polymer composition comprises, based on the total weight of the polymer composition, 5 to 95 wt. % of a first copolycarbonate consisting of bisphenol A carbonate units and first additional carbonate units of the formula (2), (3), (4), (16), or (17), wherein $R^c$ and $R^d$ are each independently a $C_{1-12}$ alkyl, $C_{2-12}$ alkenyl, $C_{3-8}$ cycloalkyl, or $C_{1-12}$ alkoxy, each $R^6$ is independently $C_{1-3}$ alkyl or phenyl, $X^a$ is a $C_{6-12}$ polycyclic aryl, $C_{3-18}$ mono- or polycycloalkylene, $C_{3-18}$ mono- or polycycloalkylidene, -$(Q^1)_x$-G-$(Q^2)_y$- group wherein $Q^1$ and $Q^2$ are each independently a $C_{1-3}$ alkylene, G is a $C_{3-10}$ cycloalkylene, x is 0 or 1, and y is 1; and m and n are each independently 0 to 4; 95 to 5 wt. % of a second copolycarbonate consisting of bisphenol A carbonate units and second additional carbonate units of the formula (1) wherein $R^a$ and $R^b$ are each independently a $C_{1-12}$ alkyl, $C_{2-12}$ alkenyl, $C_{3-8}$ cycloalkyl, or $C_{1-12}$ alkoxy, each $R^3$ is independently a $C_{1-6}$ alkyl, $R^4$ is hydrogen, $C_{1-6}$ alkyl or phenyl optionally substituted with 1 to 5 $C_{1-6}$ alkyl groups, p, q, and j are each independently 0 to 4; and 0.001 to 0.1 wt. % of a transesterification catalyst, wherein the melt-blended composition has a haze of less than 15% and a transmission greater than 75%, each measured using the color space CIE1931 (Illuminant C and a 2° observer) at a 3.2 mm thickness.

Embodiment 11

The melt-blend composition of Embodiment 10, wherein the melt-blend composition comprises at least 1 mol %, preferably at least 2 mol % or 2 mol % to 50 mol % of mixed carbonate units based on the total moles of the carbonate units in the melt-blend composition, wherein the mixed carbonate units comprise units derived from the first additional carbonate units of the first copolycarbonate and the second additional carbonate units of the second copolycarbonate.

Embodiment 12

The melt-blend composition of Embodiment 11 having a haze less than 10% measured using the color space CIE1931 (Illuminant C and a 2° observer) at a 3.2 mm thickness.

Embodiment 13

The melt-blend composition of Embodiment 11 wherein a meltpressed film of the composition is visibly transparent and is substantially free of haze.

Embodiment 14

The composition of any one or more of Embodiments 1 to 13, wherein the first copolycarbonate consists of bisphenol A carbonate units and additional carbonate units of the formula (2h) wherein each $R^1$ is independently hydrogen or $C_{1-4}$ alkyl, each $R^2$ is independently $C_{1-4}$ alkyl or hydrogen, and g is 0 to 10.

Embodiment 15

The composition of Embodiment 13, wherein the first copolycarbonate consists of bisphenol A carbonate units and 1,1-bis(4-hydroxyphenyl)-3,3,5-trimethyl-cyclohexane carbonate units.

Embodiment 16

The composition of any one or more of Embodiments 1 to 13, wherein the first copolycarbonate consists of bisphenol A carbonate units and additional carbonate units of the formula (2a), (2b), (2c), (2d), (2e), (2e), (2g), or (2i), wherein $R^c$ and $R^d$ are each independently a $C_{1-12}$ alkyl, $C_{2-12}$ alkenyl, $C_{3-8}$ cycloalkyl, or $C_{1-12}$ alkoxy; and m and n are each independently 0 to 4.

Embodiment 17

The composition of any one or more of Embodiments 1 to 16, wherein the second copolycarbonate comprises bisphenol A carbonate units and phthalimidine carbonate units of the formula (1a), wherein $R^5$ is phenyl.

Embodiment 18

The composition of any one or more of Embodiments 1 to 7, wherein the second polycarbonate comprises a first copolycarbonate consisting of bisphenol A carbonate units and 2-phenyl-3,3'-bis(4-hydroxyphenyl) phthalimidine carbonate units and a second copolycarbonate consisting of bisphenol A carbonate units and 1,1-bis(4-hydroxyphenyl)-3,3,5-trimethylcyclohexane bisphenol carbonate units.

Embodiment 19

The composition of any one or more of Embodiments 1 to 18, further comprising a polycarbonate homopolymer, optionally the polycarbonate homopolymer is present in an amount of 30 wt. % to 60 wt. % based on the total weight of the composition.

Embodiment 20

The composition of any one or more of Embodiments 1 to 19, wherein a metallized sample of the composition has a defect onset temperature that is within 20 degrees Celsius of the heat deflection temperature of the composition measured flat on a 80×10×4 mm bar with a 64 mm span at 0.45 MPa according to ISO 75/Bf.

Embodiment 21

An article, wherein the article is a molded article, a thermoformed article, an extruded film, an extruded sheet, one or more layers of a multi-layer article, a substrate for a coated article, or a substrate for a metallized article made from the composition of any one or more of Embodiments 1 to 20.

Embodiment 22

A metallized article, comprising a substrate comprising the composition of any one of Embodiments 1-20; and a metal layer disposed on at least one side of the substrate, wherein the defect onset temperature of the metallized article is within 20 degrees Celsius of the heat deflection temperature of the composition measured flat on a 80×10×4 mm bar with a 64 mm span at 0.45 MPa according to ISO 75/Bf.

The singular forms "a," "an," and "the" include plural referents unless the context clearly dictates otherwise. "Or" means "and/or." The endpoints of all ranges directed to the same component or property are inclusive and independently combinable. Unless defined otherwise, technical and scientific terms used herein have the same meaning as is commonly understood by one of skill in the art to which this invention belongs. As used herein, a "combination" is inclusive of blends, mixtures, alloys, reaction products, and the like.

Compounds are described using standard nomenclature. For example, any position not substituted by any indicated group is understood to have its valency filled by a bond as indicated, or a hydrogen atom. A dash ("-") that is not between two letters or symbols is used to indicate a point of attachment for a substituent. For example, —CHO is attached through carbon of the carbonyl group.

As used herein, the term "hydrocarbyl" and "hydrocarbon" refers broadly to a substituent comprising carbon and hydrogen, optionally with 1 to 3 heteroatoms, for example, oxygen, nitrogen, halogen, silicon, sulfur, or a combination thereof; "alkyl" refers to a straight or branched chain, saturated monovalent hydrocarbon group; "alkylene" refers to a straight or branched chain, saturated, divalent hydrocarbon group; "alkylidene" refers to a straight or branched chain, saturated divalent hydrocarbon group, with both valences on a single common carbon atom; "alkenyl" refers to a straight or branched chain monovalent hydrocarbon group having at least two carbons joined by a carbon-carbon double bond; "cycloalkyl" refers to a non-aromatic monovalent monocyclic or multicylic hydrocarbon group having at least three carbon atoms; "cycloalkylene" refers to a divalent radical formed by the removal of two hydrogen atoms from two different carbon atoms on one or more rings of a cycloalkyl group; "aryl" refers to an aromatic monovalent group containing only carbon in the aromatic ring or rings; "arylene" refers to an aromatic divalent group containing only carbon in the aromatic ring or rings; "alkylaryl" refers to an aryl group that has been substituted with an alkyl group as defined above, with 4-methylphenyl being an exemplary alkylaryl group; "arylalkyl" refers to an alkyl group that has been substituted with an aryl group as defined above, with benzyl being an exemplary arylalkyl group; "acyl" refers to an alkyl group as defined above with the indicated number of carbon atoms attached through a carbonyl carbon bridge (—C(=O)—); "alkoxy" refers to an alkyl group as defined above with the indicated number of carbon atoms attached through an oxygen bridge (—O—); and "aryloxy" refers to an aryl group as defined above with the indicated number of carbon atoms attached through an oxygen bridge (—O—).

Unless otherwise indicated, each of the foregoing groups can be unsubstituted or substituted, provided that the substitution does not significantly adversely affect synthesis, stability, or use of the compound. The term "substituted" as used herein means that at least one hydrogen on the designated atom or group is replaced with another group, provided that the designated atom's normal valence is not exceeded. When the substituent is oxo (i.e., =O), then two hydrogens on the atom are replaced. Combinations of substituents or variables are permissible provided that the substitutions do not significantly adversely affect synthesis or use of the compound. Groups that can be present on a substituted position include nitro (—NO$_2$), cyano (—CN), hydroxy (—OH), halogen, thiol (—SH), thiocyano (—SCN), $C_{2-6}$ alkanoyl (e.g., acyl (H$_3$CC(=O)—); carboxamido; $C_{1-6}$ or $C_{1-3}$ alkyl, cycloalkyl, alkenyl, and alkynyl (including groups having at least one unsaturated linkages and from 2 to 8, or 2 to 6 carbon atoms); $C_{1-6}$ or $C_{1-3}$ alkoxy; $C_{6-10}$ aryloxy such as phenoxy; $C_{1-6}$ alkylthio; $C_{1-6}$ or $C_{1-3}$ alkylsulfinyl; $C_{1-6}$ or $C_{1-3}$ alkylsulfonyl; aminodi($C_{1-6}$ or $C_{1-3}$)alkyl; $C_{6-12}$ aryl having at least one aromatic rings (e.g., phenyl, biphenyl, naphthyl, or the like, each ring either substituted or unsubstituted aromatic); $C_{7-19}$ arylalkyl having 1 to 3 separate or fused rings and from 6 to 18 ring carbon atoms; or arylalkoxy having 1 1 to 3 separate or fused rings and from 6 to 18 ring carbon atoms.

All references cited herein are incorporated by reference in their entirety. While typical embodiments have been set forth for the purpose of illustration, the foregoing descriptions should not be deemed to be a limitation on the scope herein. Accordingly, various modifications, adaptations, and alternatives can occur to one skilled in the art without departing from the spirit and scope herein.

What is claimed is:

1. A thermoplastic composition comprising:
    a polycarbonate terpolymer comprising first repeating units, second repeating units different from the first repeating units, and third repeating units different from the first and second repeating units; and wherein
    the first repeating units are phthalimidine carbonate units of the formula

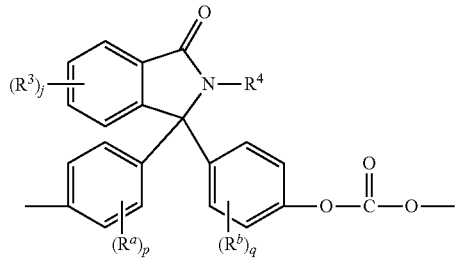

wherein
    $R^a$ and $R^b$ are each independently a $C_{1-12}$ alkyl, $C_{2-12}$ alkenyl, $C_{3-8}$ cycloalkyl, or $C_{1-12}$ alkoxy,
    each $R^3$ is independently a $C_{1-6}$ alkyl,
    $R^4$ is hydrogen, $C_{2-6}$ alkyl or phenyl optionally substituted with 1 to 5 $C_{1-6}$ alkyl groups,
    p, q, and j are each independently 0 to 4;
    the second repeating units are carbonate units of the formula

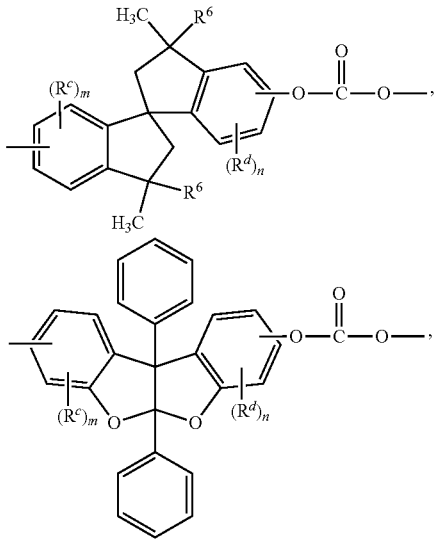

-continued

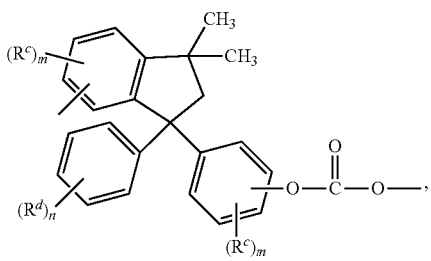

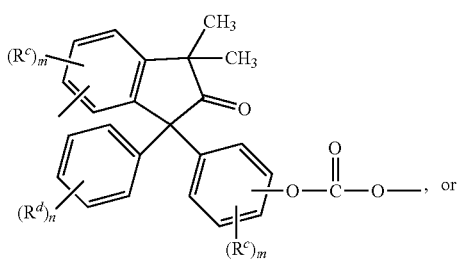, or

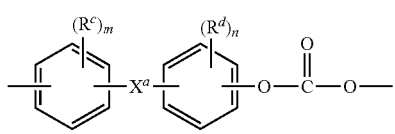

wherein
$R^c$ and $R^d$ are each independently a $C_{1-12}$ alkyl, $C_{2-12}$ alkenyl, $C_{3-8}$ cycloalkyl, or $C_{1-12}$ alkoxy, each $R^6$ is independently $C_{1-3}$ alkyl or phenyl, $X^a$ is a $C_{6-12}$ polycyclic aryl, $C_{3-18}$ mono- or polycycloalkylene, $C_{3-18}$ mono- or polycycloalkylidene, $(Q^1)_x$-G-$(Q^2)_y$- group wherein $Q^1$ and $Q^2$ are each independently a $C_{1-3}$ alkylene, G is a $C_{3-10}$ cycloalkylene, x is 0 or 1, and y is 1; and m and n are each independently 0 to 4; and the third repeating units are carbonate units of the formula

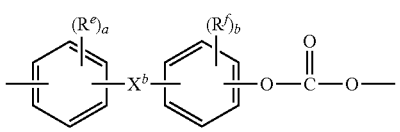

wherein
$R^e$ and $R^f$ are each independently $C_{1-12}$ alkyl, $C_{2-12}$ alkenyl, $C_{3-8}$ cycloalkyl, or $C_{1-12}$ alkoxy, a and b are each independently integers of 0 to 4, and $X^b$ is a single bond, —O—, —S—, —S(O)—, —S(O)$_2$—, —C(O)—, or $C_{1-32}$ bridging hydrocarbon group, provided that $X^b$ is not a phthalimidine group or $X^a$; and a second polycarbonate component, wherein the second polycarbonate component comprises a first copolycarbonate consisting of bisphenol A carbonate units and first additional carbonate units of the formula

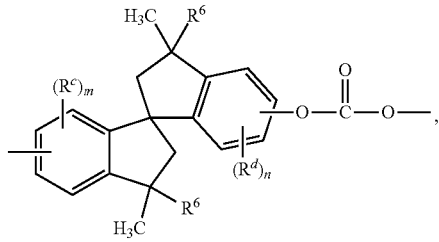

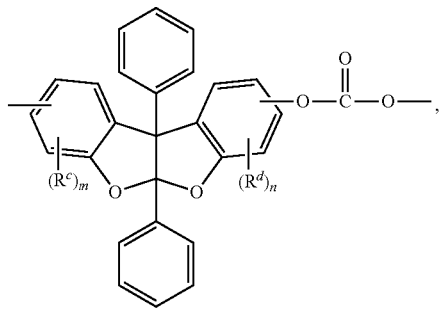

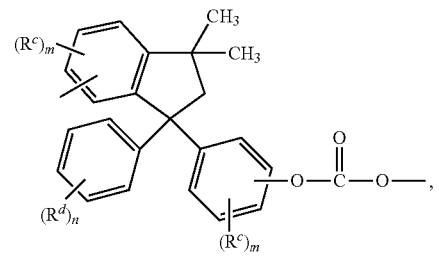

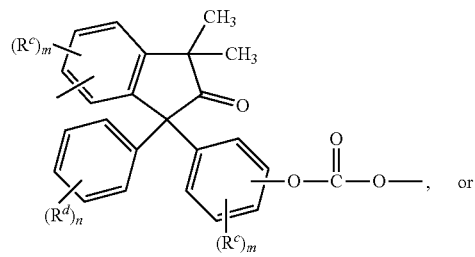, or

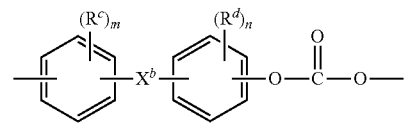

wherein
$R^c$ and $R^d$ are each independently a $C_{1-12}$ alkyl, $C_{2-12}$ alkenyl, $C_{3-8}$ cycloalkyl, or $C_{1-12}$ alkoxy, each $R^6$ is independently $C_{1-3}$ alkyl or phenyl, $X^a$ is a a $C_{6-12}$ polycyclic aryl, $C_{3-18}$ mono- or polycycloalkylene, $C_{3-18}$ mono- or polycycloalkylidene, $(Q^1)_x$-G-$(Q^2)_y$- group wherein $Q^1$ and $Q^2$ are each independently a $C_{1-3}$ alkylene, G is a $C_{3-10}$ cycloalkylene, x is 0 or 1, and y is 1; and m and n are each independently 0 to 4;

or a second copolycarbonate consisting of bisphenol A carbonate units and second additional carbonate units of the formula

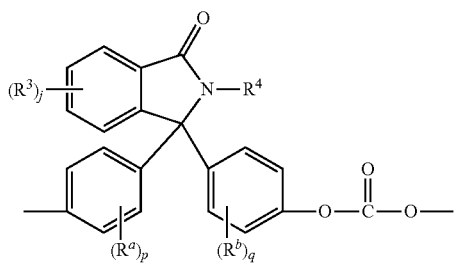

wherein $R^a$ and $R^b$ are each independently a $C_{1-12}$ alkyl, $C_{2-12}$ alkenyl, $C_{3-8}$ cycloalkyl, or $C_{1-12}$ alkoxy, each $R^3$ is independently a $C_{1-6}$ alkyl, $R^4$ is hydrogen, $C_{1-6}$ alkyl or phenyl optionally substituted with 1 to 5 $C_{1-6}$ alkyl groups, p, q, and j are each independently 0 to 4, or a combination comprising the first copolycarbonate and the second copolycarbonate, wherein the composition has a haze of less than 15% and a transmission greater than 75%, each measured using the color space CIE1931 with Illuminant C and a 2° observer at a 3.2 mm thickness.

2. The thermoplastic composition of claim 1, wherein the first repeating units of the polycarbonate terpolymer are phthalimidine carbonate units of the formula

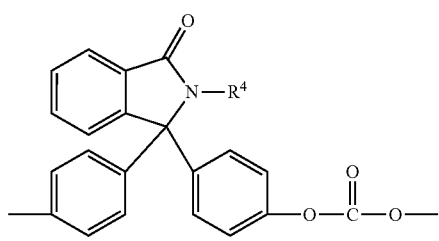

wherein $R^5$ is phenyl.

3. The thermoplastic composition of claim 1, wherein the second repeating units of the polycarbonate terpolymer have the structural formula

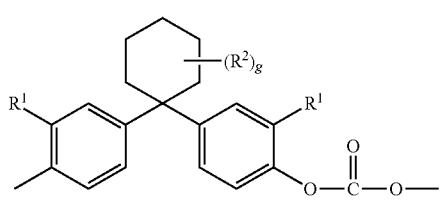

wherein each $R^1$ is independently hydrogen or $C_{1-4}$ alkyl, each $R^2$ is independently $C_{1-4}$ alkyl or hydrogen, and g is 0 to 10.

4. The thermoplastic composition of claim 1, wherein the second repeating units of the polycarbonate terpolymer are carbonate units of the formula:

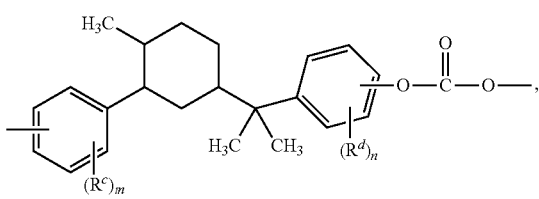

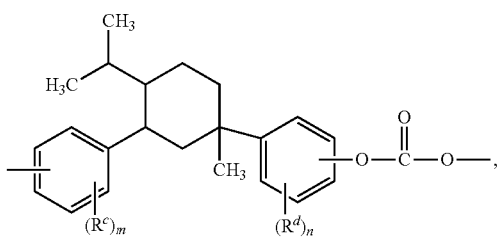

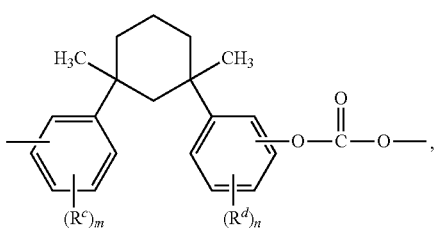

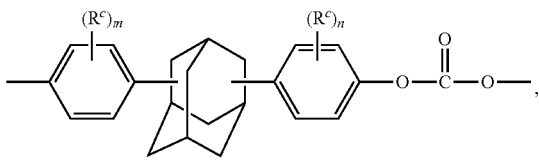

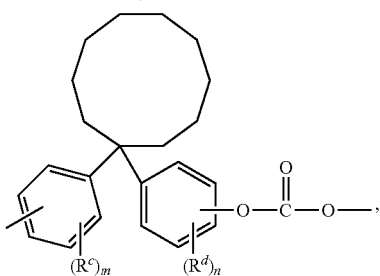

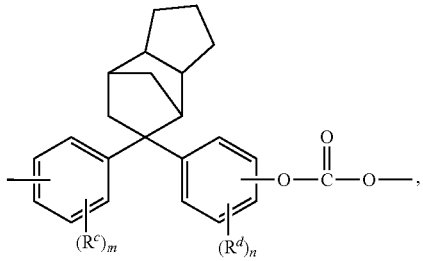

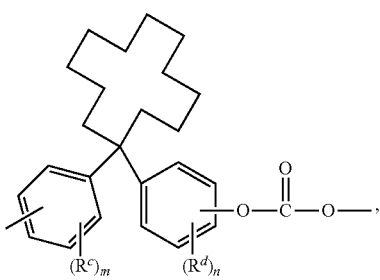

-continued

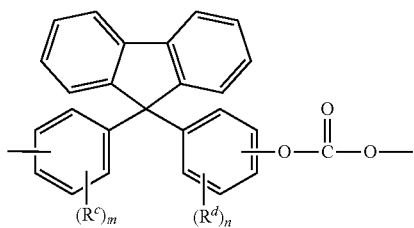

wherein
$R^c$ and $R^d$ are each independently a $C_{1-12}$ alkyl, $C_{2-12}$ alkenyl, $C_{3-8}$ cycloalkyl, or $C_{1-12}$ alkoxy; and
m and n are each independently 0 to 4.

5. The thermoplastic composition of claim 1, wherein the third repeating units of the polycarbonate terpolymer are bisphenol A carbonate units.

6. The thermoplastic composition of claim 1, wherein the polycarbonate terpolymer comprises 3 mol % to 28 mol % of the first repeating units, 4 mol % to 20 mol % of the second repeating units, and 45 mol % to 70 mol % of the third repeating units, each based on the sum of moles of the first repeating units, second repeating units, and third repeating units.

7. The thermoplastic composition of claim 1, wherein the composition comprises 5 to 90 wt. % of the polycarbonate terpolymer; and 10 to 95 wt % of the second polycarbonate component, each based on the total weight of the thermoplastic composition.

8. A melt-blend composition formed from, based on the total weight of the melt-blend composition,
0 to 5 wt. % of an additive; and
95 to 100 wt. % of a polymer composition, wherein the polymer composition comprises, based on the total weight of the polymer composition,
5 to 95 wt. % of a first copolycarbonate consisting of bisphenol A carbonate units and first additional carbonate units of the formula

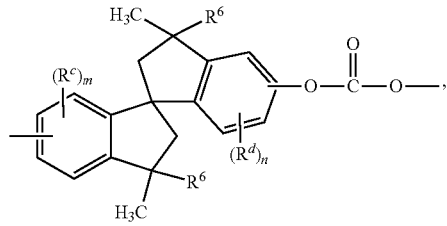

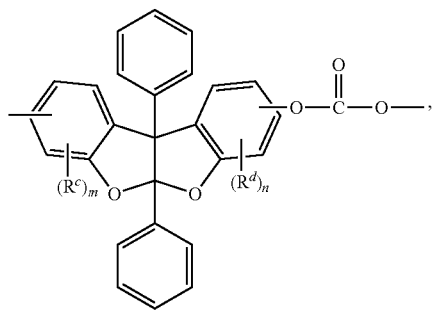

-continued

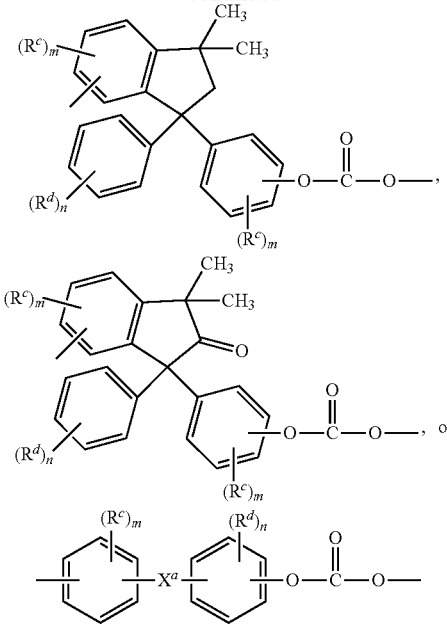

wherein
$R^c$ and $R^d$ are each independently a $C_{1-12}$ alkyl, $C_{2-12}$ alkenyl, $C_{3-8}$ cycloalkyl, or $C_{1-12}$ alkoxy,
each $R^6$ is independently $C_{1-3}$ alkyl or phenyl,
$X^a$ is a $C_{6-12}$ polycyclic aryl, $C_{3-18}$ mono- or polycycloalkylene, $C_{3-18}$ mono- or polycycloalkylidene, $-(Q^1)_x-G-(Q^2)_y-$ group wherein $Q^1$ and $Q^2$ are each independently a $C_{1-3}$ alkylene, G is a $C_{3-10}$ cycloalkylene, x is 0 or 1, and y is 1; and
m and n are each independently 0 to 4;
95 to 5 wt. % of a second copolycarbonate consisting of bisphenol A carbonate units and second additional carbonate units of the formula

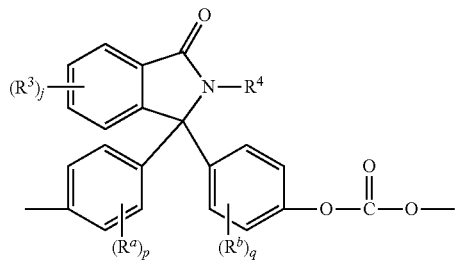

wherein
$R^a$ and $R^b$ are each independently a $C_{1-12}$ alkyl, $C_{2-12}$ alkenyl, $C_{3-8}$ cycloalkyl, or $C_{1-12}$ alkoxy,
each $R^3$ is independently a $C_{1-6}$ alkyl,
$R^4$ is hydrogen, $C_{1-6}$ alkyl or phenyl optionally substituted with 1 to 5 $C_{1-6}$ alkyl groups,
p, q, and j are each independently 0 to 4; and
0.001 to 0.1 wt. % of a transesterification catalyst,
wherein the melt-blended composition has a haze of less than 15% and a transmission greater than 75%, each measured using the color space CIE1931 with Illuminant C and a 2° observer at a 3.2 mm thickness.

9. The melt-blend composition of claim 8, wherein the melt-blend composition comprises at least 1 mol % of mixed carbonate units based on the total moles of the carbonate units in the melt-blend composition, wherein the mixed carbonate units comprise units derived from the first additional carbonate units of the first copolycarbonate and the second additional carbonate units of the second copolycarbonate.

10. The melt-blend composition of claim 9 having a haze less than 10% measured using the color space CIE1931 with Illuminant C and a 2° observer at a 3.2 mm thickness.

11. The melt-blend composition of claim 9 wherein a meltpressed film of the composition is visibly transparent and is substantially free of haze.

12. The composition of claim 1, wherein the first copolycarbonate consists of bisphenol A carbonate units and additional carbonate units of the formula

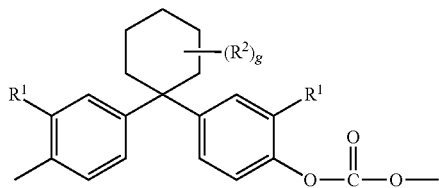

wherein
each $R^1$ is independently hydrogen or $C_{1-4}$ alkyl,
each $R^2$ is independently $C_{1-4}$ alkyl or hydrogen, and
g is 0 to 10.

13. The composition of claim 12, wherein the first copolycarbonate consists of bisphenol A carbonate units and 1,1-bis(4-hydroxyphenyl)-3,3,5-trimethyl-cyclohexane carbonate units.

14. The composition of claim 1, wherein the first copolycarbonate consists of bisphenol A carbonate units and additional carbonate units of the formula

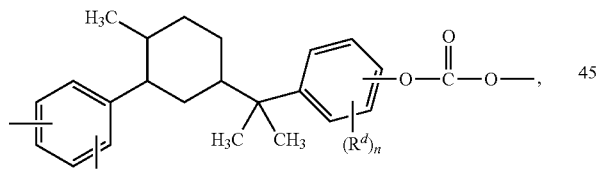

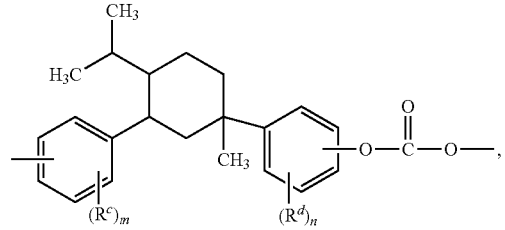

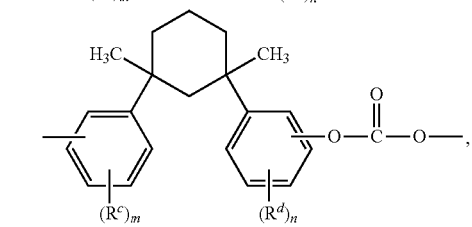

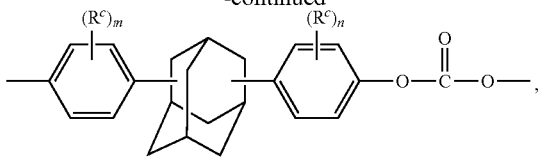

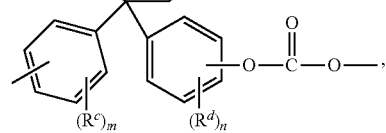

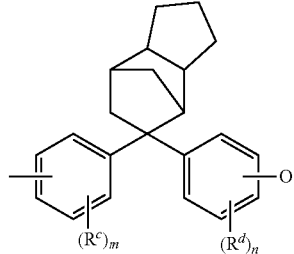

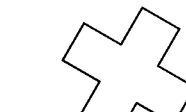

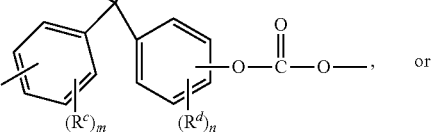

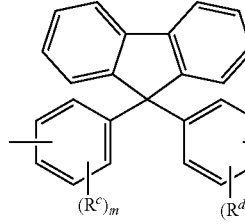

wherein
$R^c$ and $R^d$ are each independently a $C_{1-12}$ alkyl, $C_{2-12}$ alkenyl, $C_{3-8}$ cycloalkyl, or $C_{1-12}$ alkoxy; and
m and n are each independently 0 to 4.

15. The composition of claim 1, wherein the second copolycarbonate comprises bisphenol A carbonate units and phthalimidine carbonate units of the formula

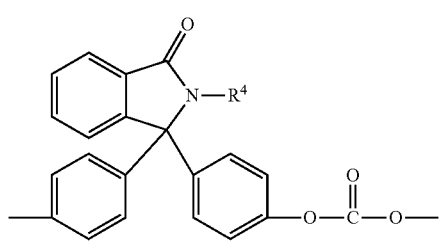

wherein $R^5$ is phenyl.

16. The composition of claim 1, wherein the second polycarbonate component comprises
   the second copolycarbonate, which consists of bisphenol A carbonate units and 2-phenyl-3,3'-bis(4-hydroxyphenyl) phthalimidine carbonate units; and
   the first copolycarbonate, which consists of bisphenol A carbonate units and 1,1-bis(4-hydroxyphenyl)-3,3,5-trimethylcyclohexane bisphenol carbonate units.

17. The composition of claim 1, further comprising a polycarbonate homopolymer.

18. The composition of claim 1, wherein a metallized sample of the composition has a defect onset temperature that is within 20 degrees Celsius of the heat deflection temperature of the composition measured flat on a 80×10×4 mm bar with a 64 mm span at 0.45 MPa according to ISO 75/Bf.

19. An article, wherein the article is a molded article, a thermoformed article, an extruded film, an extruded sheet, one or more layers of a multi-layer article, a substrate for a coated article, or a substrate for a metallized article made from the composition of claim 1.

20. A metallized article, comprising
   a substrate comprising the composition of claim 1; and
   a metal layer disposed on at least one side of the substrate,
   wherein the defect onset temperature of the metallized article is within 20 degrees Celsius of the heat deflection temperature of the composition measured flat on a 80×10×4 mm bar with a 64 mm span at 0.45 MPa according to ISO 75/Bf.

* * * * *